(12) United States Patent
Huang et al.

(10) Patent No.: US 12,543,604 B2
(45) Date of Patent: Feb. 3, 2026

(54) ADDING SEALING MATERIAL TO WAFER EDGE FOR WAFER BONDING

(71) Applicant: Taiwan Semiconductor Manufacturing Co., Ltd., Hsinchu (TW)

(72) Inventors: Yu-Yi Huang, Taipei (TW); Yu-Hung Lin, Taichung (TW); Wei-Ming Wang, Taichung (TW); Chen Chen, New Taipei (TW); Shih-Peng Tai, Xinpu Township (TW); Kuo-Chung Yee, Taoyuan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 391 days.

(21) Appl. No.: 18/151,663

(22) Filed: Jan. 9, 2023

(65) Prior Publication Data
US 2024/0096830 A1 Mar. 21, 2024

Related U.S. Application Data

(60) Provisional application No. 63/376,207, filed on Sep. 19, 2022.

(51) Int. Cl.
*H01L 21/304* (2006.01)
*H01L 23/00* (2006.01)
*H01L 25/065* (2023.01)

(52) U.S. Cl.
CPC .......... *H01L 24/08* (2013.01); *H01L 21/3043* (2013.01); *H01L 24/03* (2013.01);
(Continued)

(58) Field of Classification Search
CPC ..... H01L 24/08; H01L 21/3043; H01L 24/80; H01L 25/0657
See application file for complete search history.

(56) References Cited

U.S. PATENT DOCUMENTS 6,008,070 A * 12/1999 Farnworth ........ H01L 23/49827
438/110
11,610,858 B2 * 3/2023 Chen ....................... H01L 24/09
(Continued)

FOREIGN PATENT DOCUMENTS

CN 104752322 A 7/2015
CN 112289694 A 1/2021
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A method includes forming a first sealing layer at a first edge region of a first wafer; and bonding the first wafer to a second wafer to form a wafer stack. At a time after the bonding, the first sealing layer is between the first edge region of the first wafer and a second edge region of the second wafer, with the first edge region and the second edge region comprising bevels. An edge trimming process is then performed on the wafer stack. After the edge trimming process, the second edge region of the second wafer is at least partially removed, and a portion of the first sealing layer is left as a part of the wafer stack. An interconnect structure is formed as a part of the second wafer. The interconnect structure includes redistribution lines electrically connected to integrated circuit devices in the second wafer.

20 Claims, 24 Drawing Sheets

(52) U.S. Cl.
CPC .............. *H01L 24/80* (2013.01); *H01L 24/94* (2013.01); *H01L 25/0657* (2013.01); *H01L 2224/0221* (2013.01); *H01L 2224/03019* (2013.01); *H01L 2224/03831* (2013.01); *H01L 2224/0384* (2013.01); *H01L 2224/03845* (2013.01); *H01L 2224/08145* (2013.01); *H01L 2224/80007* (2013.01); *H01L 2224/80895* (2013.01); *H01L 2224/80896* (2013.01); *H01L 2224/94* (2013.01); *H01L 2225/06506* (2013.01); *H01L 2225/0651* (2013.01); *H01L 2225/06524* (2013.01); *H01L 2225/06527* (2013.01); *H01L 2225/06541* (2013.01); *H01L 2924/3512* (2013.01)

(56) References Cited

U.S. PATENT DOCUMENTS

| | | |
|---|---|---|
| 2008/0268614 A1 | 10/2008 | Yang et al. |
| 2014/0264762 A1 | 9/2014 | Rajoo et al. |
| 2020/0006145 A1 | 1/2020 | Li et al. |
| 2021/0118832 A1 | 4/2021 | Chen et al. |
| 2022/0037268 A1 | 2/2022 | Shen et al. |
| 2022/0293556 A1 | 9/2022 | Li et al. |
| 2022/0293561 A1 | 9/2022 | Lo et al. |
| 2023/0317445 A1 | 10/2023 | Hua et al. |

FOREIGN PATENT DOCUMENTS

| | | |
|---|---|---|
| CN | 113224071 A | 8/2021 |
| TW | M285028 U | 1/2006 |
| TW | 200842933 A | 11/2008 |
| TW | 201448055 A | 12/2014 |
| TW | 202002094 A | 1/2020 |
| TW | 202221885 A | 6/2022 |
| TW | 202223987 A | 6/2022 |
| TW | 202236365 A | 9/2022 |
| TW | 202236383 A | 9/2022 |

* cited by examiner

ADDING SEALING MATERIAL TO WAFER EDGE FOR WAFER BONDING

PRIORITY CLAIM

This application claims the benefit of U.S. Provisional Application No. 63/376,207 filed on Sep. 19, 2022, entitled "Adding Sealing Material to Wafer Edge for Wafer Bonding," which application is hereby incorporated herein by reference.

BACKGROUND

Wafer-to-wafer bonding is commonly used in the packaging of integrated circuits. For example, a device wafer having through-vias penetrating through a substrate of the device wafer may be bonded to a carrier wafer or another device wafer. The device wafer may then be thinned, and electrical connectors may be formed on the backside of the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
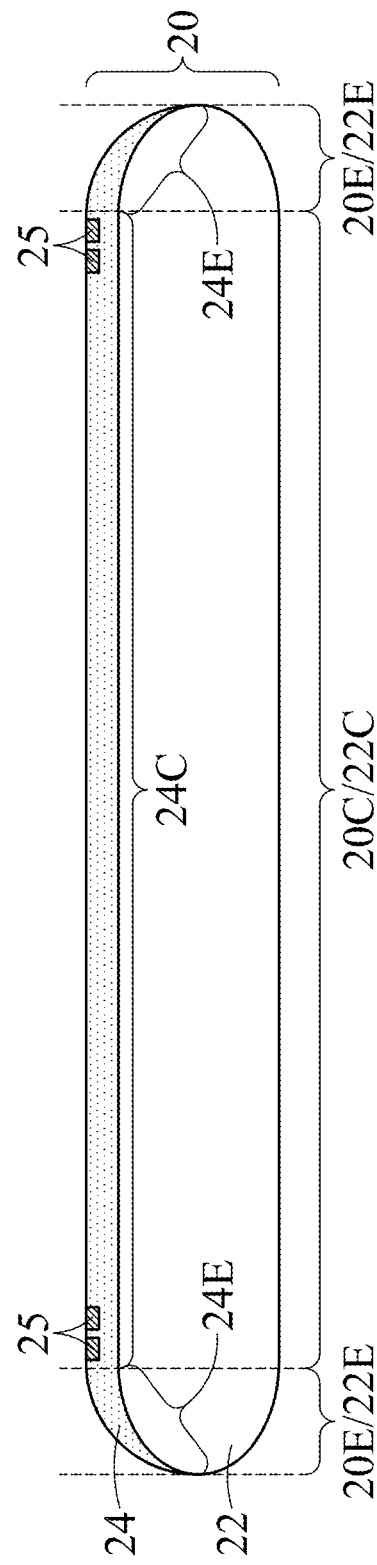
FIGS. 1 and 2 illustrate cross-sectional views of carrier wafers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer bonding and trimming process and the formation of a resulting package are provided. In accordance with some embodiments of the present disclosure, a first wafer is bonded to a second wafer. A sealing layer is formed in the gap between the bonded wafers. The formation of the sealing layer may be performed before or after the wafer bonding process. The sealing layer may be formed of a material that may ensure the high temperature in subsequent processes. Accordingly, in the subsequent formation process, the sealing layer may remain in the package to enhance the mechanical strength of the resulting bonded wafers, and to reduce the wafer edge chipping problem. The Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Referring to FIG. 1, wafer 20 is formed. In accordance with some embodiments, wafer 20 is a carrier wafer, and hence is referred to as carrier wafer 20 hereinafter. Carrier wafer 20 may have a round top-view shape. In accordance with some embodiments, carrier wafer 20 includes substrate 22. Substrate 22 may be formed of or comprise silicon, while other materials such as ceramic, glass (such as silicate glass), or the like, may also be used. In accordance with some embodiments, the entire substrate 22 is formed of a homogeneous material, with no other material different from the homogeneous material therein. For example, the entire substrate 22 may be formed of silicon (doped or undoped), and there are no metal features, dielectric features, etc., therein.

Bond layer 24 is formed on substrate 22. In accordance with some embodiments, bond layer 24 is formed of or comprises a dielectric material, which may be a silicon-based dielectric material such as silicon oxide ($SiO_2$), SiN, SiON, SiOCN, SiC, SiCN, or the like, or combinations thereof. In accordance with some embodiments of the present disclosure, bond layer 24 is formed using High-Density Plasma Chemical Vapor Deposition (HDPCVD), Plasma Enhanced Chemical Vapor Deposition (PECVD), Chemical Vapor Deposition (CVD), Low-Pressure Chemical Vapor Deposition (LPCVD), Atomic Layer deposition (ALD), or the like.

In accordance with some embodiments, bond layer 24 is a single layer that is in physical contact with substrate 22. In accordance with alternative embodiments, bond layer 24 is a composite layer including a plurality of layers. For example, bond layer 24 may include an oxide-based layer formed of an oxide-based material (which may also be silicon oxide based) such as silicon oxide, phospho-silicate glass (PSG), borosilicate glass (BSG), boron-doped phospho silicate glass (BPSG), fluorine-doped silicate glass (FSG), or the like. Bond layer 24 may also include a nitride-based layer formed of or comprising silicon nitride, while it may also be formed of or comprise other materials such as SiON. In accordance with some embodiments of the present disclosure, the layers in bond layer 24 may be formed using PECVD, CVD, LPCVD, ALD, or the like.

There may also be alignment marks 25 formed in bond layer 24, which alignment marks 25 are used for aligning wafers in subsequent bonding processes. The alignment marks 25 may be formed as metal plugs, which may be formed through damascene processes.

As shown in FIG. 1, wafer 20 includes edge portion 20E, and inner portion 20C encircled by edge portion 20E. Similarly, substrate 22 includes edge portion 22E, and inner portion 22C encircled by edge portion 22E. Bond layer 24 also includes edge portion 24E, and inner portion 24C encircled by edge portion 24E. When viewed from top, each of edge portions 20E, 22E, and 24E forms a fully ring. In accordance with some embodiments, inner portion 24C of bond layer 24 is conformal and has a uniform thickness. The edge portion 24E, on the other hand, has inner parts closer to inner portion 24C, and outer parts farther away the center of wafer 20 than the respective inner portions. The outer parts may be increasingly thinner than the respective inner parts.

Figure 2:
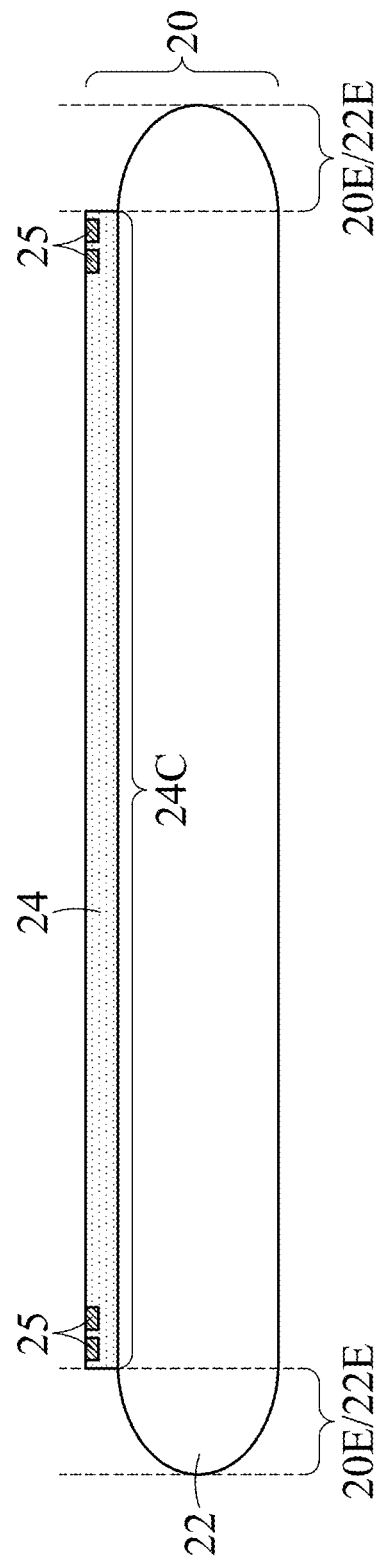

In accordance with some embodiments, when wafer 20 is used for wafer-to-wafer bonding, bond layer 24 is not patterned, and extends to the bevel regions (edge regions) 20E of wafer 20. In the edge regions 20E, the top surface of substrate 22 is curved. In accordance with alternative embodiments, as shown in FIG. 2, before the wafer-to-wafer bonding, bond layer 24 is patterned, for example, through a photolithography process, in which an etching mask (such as a photoresist, not shown) is formed, and bond layer 24 is patterned through etching. The edge portions 24E as shown in FIG. 1 are removed, and the resulting structure is shown in FIG. 2.

Figure 3:
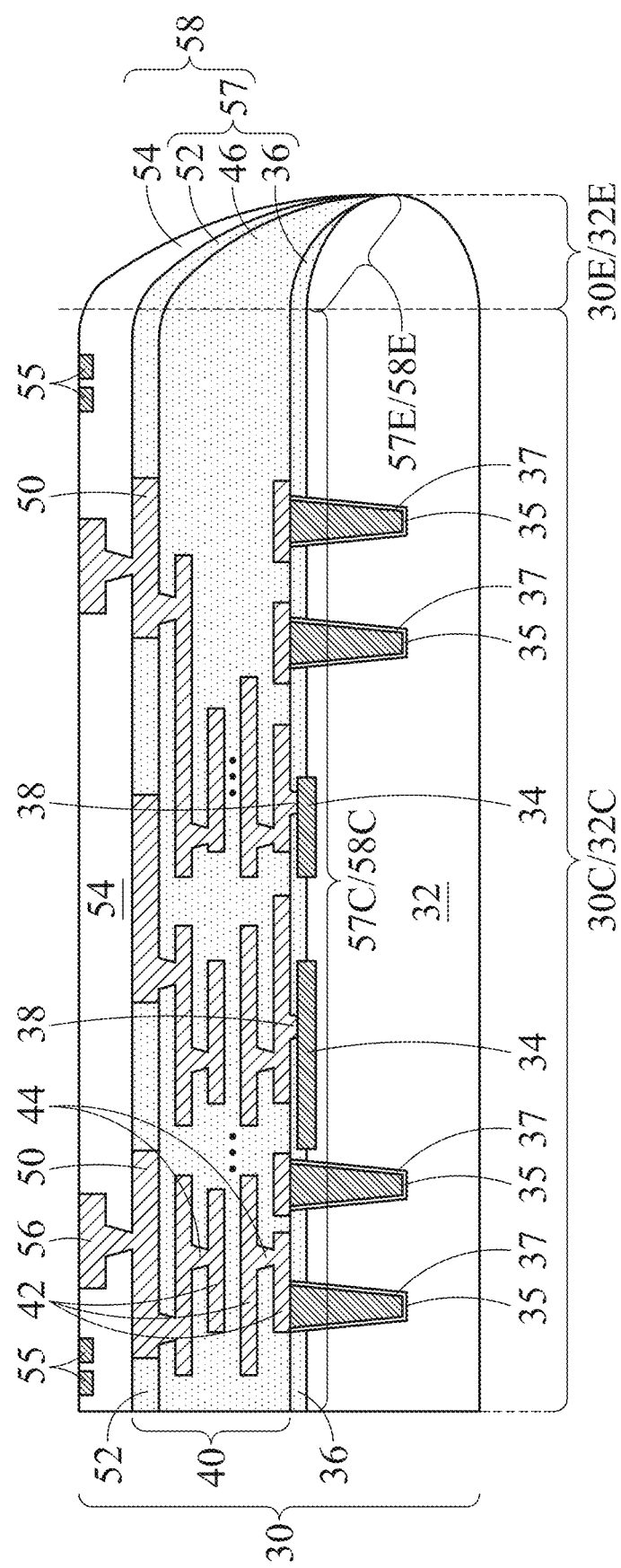
FIGS. 3 and 4 illustrate cross-sectional views of device wafers in accordance with some embodiments.

Referring to FIG. 3, device wafer 30 is formed. Device wafer 30 may also have a round top-view shape, and FIG. 3 illustrates the right portion of device wafer 30. In accordance with some embodiments, device wafer 30 includes substrate 32. Substrate 32 may be a semiconductor substrate such as a silicon substrate. In accordance with other embodiments, substrate 32 may include other semiconductor materials such as silicon germanium, carbon-doped silicon, or the like. Substrate 32 may be a bulk substrate, or may have a layered structure, for example, including a silicon substrate and a silicon germanium layer over the silicon substrate.

Through-substrate vias 35, which are alternatively referred to as through-vias hereinafter, may be formed to extend from the front side (the illustrated top side) of substrate 32 into substrate 32. The bottoms of through-vias 35 are at a level between the top surface and the bottom surface of substrate 32. Isolation layers 37 are formed to separate through-substrate vias 35 from substrate 32. Isolation layers 37 are formed of a dielectric material. In accordance with alternative embodiments, no through-vias are formed, depending on the function of device wafer 30.

In accordance with some embodiments, device wafer 30 includes a plurality of device dies therein. Some of the illustrated features may be parts of a same device die among a plurality of identical device dies. The device dies may include logic dies, memory dies, input-output dies, Integrated Passive Devices (IPDs), or the like, or combinations thereof. For example, the logic device dies in device wafer 30 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in device wafer 30 may include Static Random-Access Memory (SRAM) dies, Dynamic Random-Access Memory (DRAM) dies, or the like.

In accordance with some embodiments of the present disclosure, integrated circuit devices 34 are formed at the top surface of semiconductor substrate 32. Example integrated circuit devices 34 may include Complementary Metal-Oxide Semiconductor (CMOS) transistors, resistors, capacitors, diodes, and/or the like. The details of integrated circuit devices 34 are not illustrated herein. In accordance with alternative embodiments, device wafer 30 is used for forming interposers, which are free from active devices, and may or may not include passive devices.

Inter-Layer Dielectric (ILD) 36 is formed over semiconductor substrate 32 and fills the space between the gate stacks of transistors (not shown) in integrated circuit devices 34. In accordance with some example embodiments, ILD 36 is formed of or comprises silicon oxide, Phospho Silicate Glass (PSG), Boro Silicate Glass (BSG), Boron-Doped Phospho Silicate Glass (BPSG), Fluorine-Doped Silicate Glass (FSG), or the like. ILD 36 may be formed using spin-on coating, Flowable Chemical Vapor Deposition (FCVD), Chemical Vapor Deposition (CVD), or the like. In accordance with some embodiments of the present disclosure, ILD 36 is formed using a deposition method such as PECVD, LPCVD, or the like.

Contact plugs 38 are formed in ILD 36, and are used to electrically connect integrated circuit devices 34 to overlying metal lines 42 and vias 44. In accordance with some embodiments of the present disclosure, contact plugs 38 are formed of a conductive material selected from tungsten, aluminum, copper, titanium, tantalum, titanium nitride, tantalum nitride, alloys thereof, and/or multi-layers thereof.

Interconnect structure 40 is formed over ILD 36 and contact plugs 38. Interconnect structure 40 includes metal lines 42 and vias 44, which are formed in dielectric layers 46. Dielectric layers 46 may include Inter-Metal Dielectric (IMD) layers 46 hereinafter. In accordance with some embodiments of the present disclosure, some of dielectric layers 46 are formed of low-k dielectric materials having dielectric constant values (k-values) lower than about 3.5 or 3.0. Dielectric layers 46 may be formed of or comprise a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 46 are formed of non-low-k dielectric materials such as silicon oxide, silicon carbide (SiC), silicon carbo-nitride (SiCN), silicon oxy-carbo-nitride (SiOCN), or the like. Etch stop layers (not shown), which may be formed of silicon carbide, silicon nitride, silicon oxynitride, silicon oxycarbide, aluminum oxide, aluminum nitride, or the like, or multi-layers thereof, are formed between dielectric layers 46, and are not shown.

Metal lines 42 and vias 44 are formed in dielectric layers 46. The metal lines 42 at a same level are collectively referred to as a metal layer hereinafter. In accordance with some embodiments of the present disclosure, interconnect structure 40 includes a plurality of metal layers that are interconnected through vias 44. Metal lines 42 and vias 44 may be formed of or comprise copper or copper alloys, or other metals. The formation process may include single damascene processes and dual damascene processes.

Dielectric layers 46 may further include passivation layers over the low-k dielectric layers. For example, there may be undoped silicate-glass (USG) layers, silicon oxide layers, silicon nitride layers, etc., over the low-k dielectric layers.

The passivation layers are denser than the low-k dielectric layers, and have the function of isolating the low-k dielectric layers from detrimental chemicals and gases such as moisture in external environment.

In accordance with some embodiments, there may be metal pads 50 formed over interconnect structure 40 and electrically connecting to integrated circuit devices 34 through metal lines 42 and vias 44. The metal pads 50 are formed in dielectric layer 52. The metal pads 50 may be formed of or comprise copper, nickel, titanium, palladium, or the like, or alloys thereof. In accordance with some embodiments, metal pads 50 are in a passivation layer 52. In accordance with alternative embodiments, a polymer layer (which may be polyimide, polybenzoxazole (PBO), or the like) may be formed, with the metal pads 50 being in the polymer layer.

Bond layer 54 is deposited as a top surface layer of device wafer 30. Bond layer 54 may be formed of a material selected from the same group of candidate materials for forming bond layer 24. For example, bond layer 54 may be formed of or comprises a material selected from silicon oxide ($SiO_2$), SiN, SiON, SiOCN, SiC, SiCN, or the like, or combinations thereof. The material of bond layers 24 and 54 may be the same as each other or different from each other. Carrier wafer 30 may include alignment marks 55, which are used for aligning wafers in subsequent bonding processes. Alignment marks 55 may be metal features formed in bond layer 54.

In accordance with some embodiments, wafer 30 is bonded to another wafer through hybrid bonding, and bond pads 56 are formed in bond layer 54. Bond pads 56 have top surfaces that are coplanar with the top surface of bond layer 54. Bond pads 56 may comprise copper, and may also include diffusion barrier layers to separate copper from bond layer 54. In accordance with alternative embodiments, wafer 30 is bonded to another wafer through fusion bonding, and hence no bond pads 56 are formed in bond layer 54.

As also shown in FIG. 3, ILD 36, dielectric layers 46, and passivation layer 52 are collectively referred to as dielectric layers 57, and dielectric layers 57 and bond layer 54 are collectively referred to as dielectric layers 58. Similar to wafer 20, wafer 30 includes edge portion 30E forming a ring, and inner portion 30C encircled by edge portion 30E. Substrate 32 includes edge portion 32E, and inner portion 32C encircled by edge portion 32E. Dielectric layers 57/58 include edge portion 57E/58E and inner portion 57C/58C encircled by the edge portion 57E/58E. Each of edge portions 30E, 32E, and 57E/58E forms a full ring encircling the respective inner portions 30C, 32C, and 57C/58C. In accordance with some embodiments, at least some of inner portion 57C/58C may be conformal and may have a uniform thickness. The edge portions 57E/58E, on the other hand, have inner parts closer to inner portion 57C/58C, and outer parts farther away from the center of wafer 30 than the respective inner parts. The outer parts may be increasingly thinner than the respective inner parts.

Figure 4:
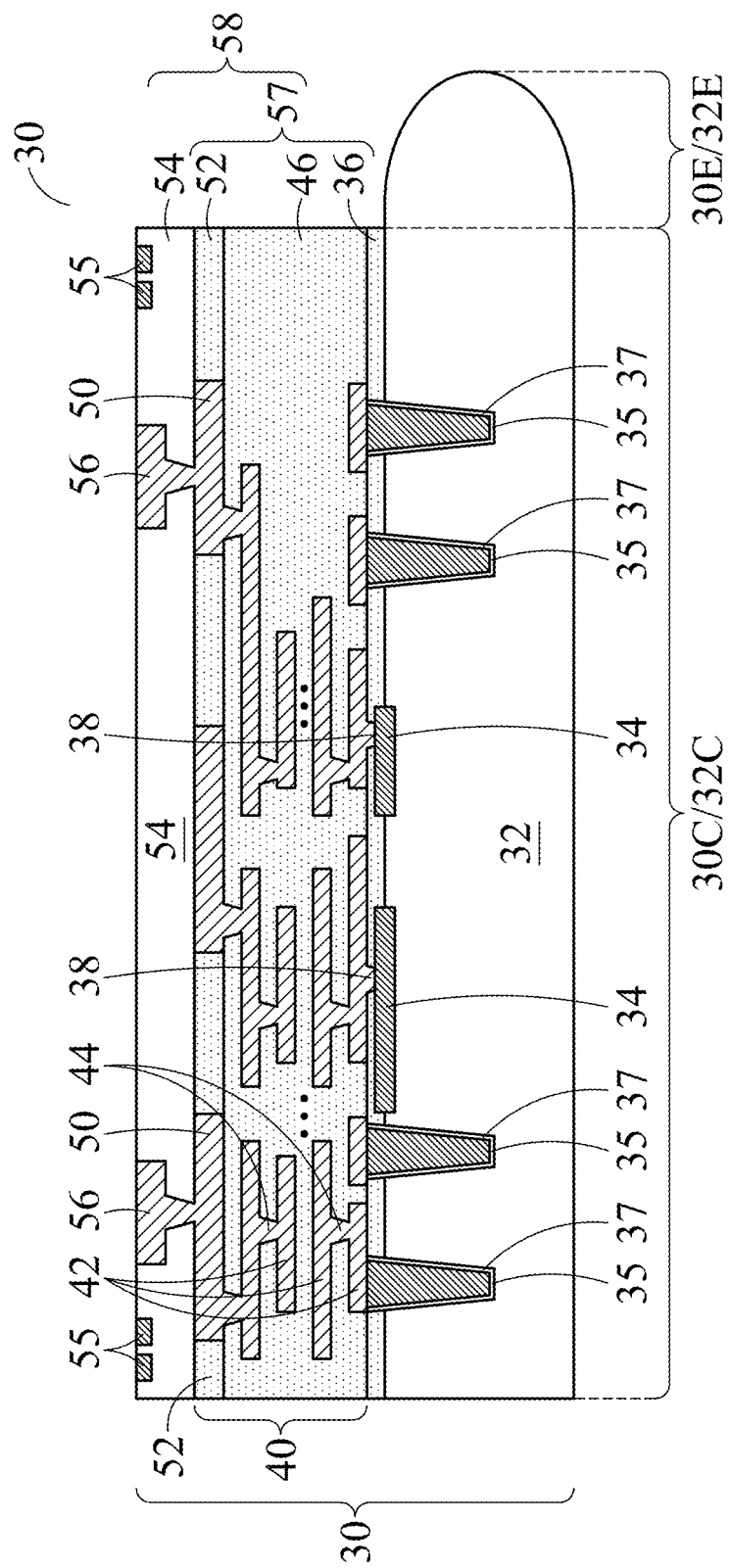

In accordance with some embodiments, when wafer 30 is used for wafer-to-wafer bonding, dielectric layers 58 extend to the bevel regions (edge regions) of wafer 30, in which edge regions, the top surface of substrate 32 is curved. In accordance with alternative embodiments, as shown in FIG. 4, before the wafer-to-wafer bonding, dielectric layers 58 are patterned, for example, through a photolithography process, in which an etching mask (such as a photoresist) is formed, and dielectric layers 58 are patterned through an etching process. The edge portions 58E as shown in FIG. 3 are removed, and the resulting wafer 30 is shown in FIG. 4.

Figure 22:
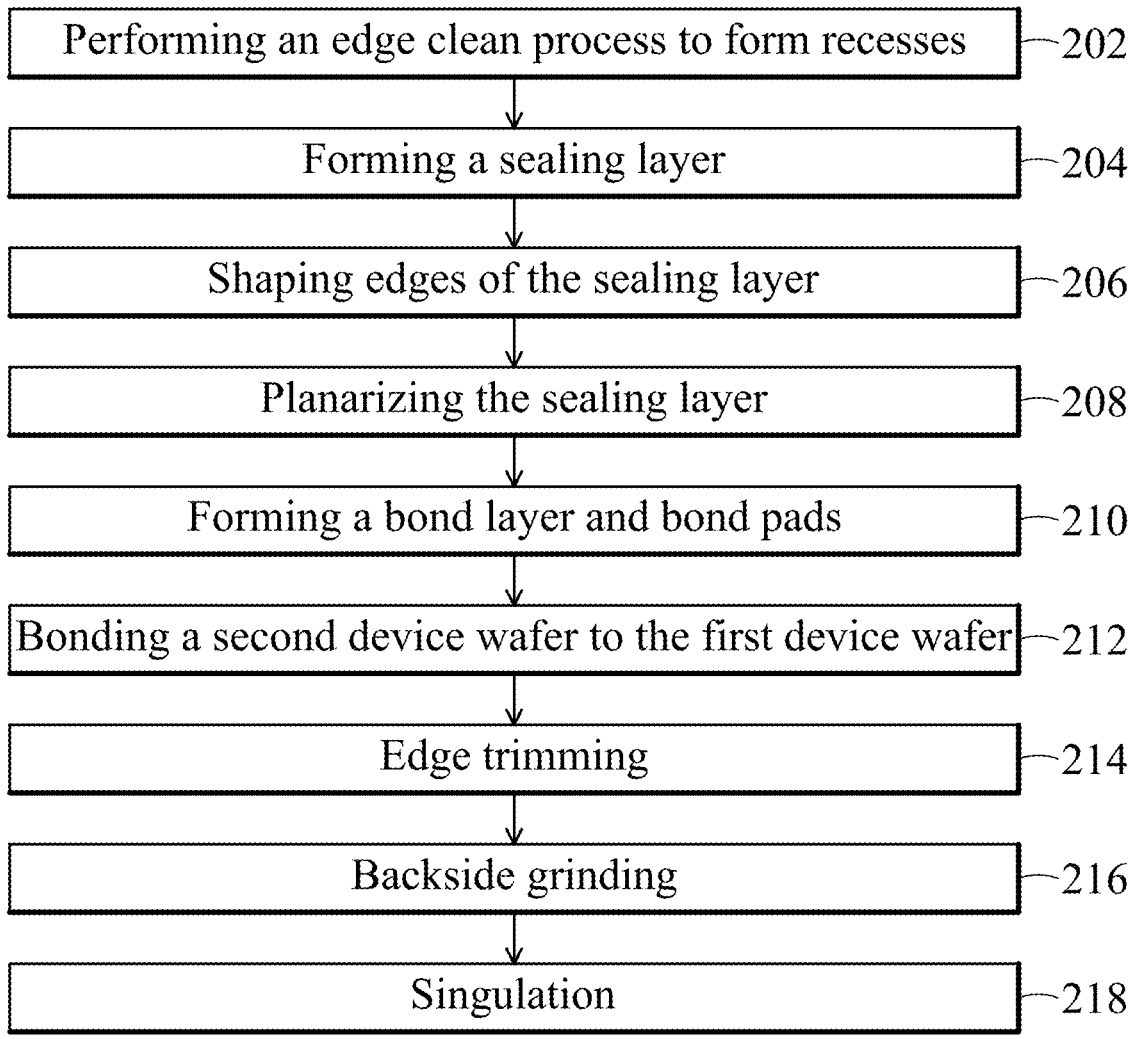
FIG. 22 illustrates a process flow for a wafer bonding and trimming process in accordance with some embodiments.

FIGS. 5-13, 14A, and 14B illustrate the cross-sectional views of intermediate stages in a wafer-to-wafer bonding process and the formation of the respective packages in accordance with some embodiments. The respective processes are shown in the process flow 200 as shown in FIG. 22. In the following discussion, device wafers 30 are used as examples in accordance with some embodiments. Device wafers 30 may be identified by following reference number "30" with a "-" sign and a number 1 or 2, which number indicates the tier-number of the respective device wafer. Some of the features in device wafers 30-1 and 30-2 may also be distinguished from each other through the tier number. For example, the substrates, the dielectric layers, the bond pads, and the through-vias may be denoted with the corresponding reference numbers as shown in FIG. 3 or FIG. 4 followed by the corresponding tier numbers.

Also, in the following discussed example process, the bottom wafer is shown as a device wafer (as shown in FIG. 3 or 4). In alternative embodiments, the bottom wafer may also be a carrier wafer (as shown in FIG. 1 or 2).

Figure 5:
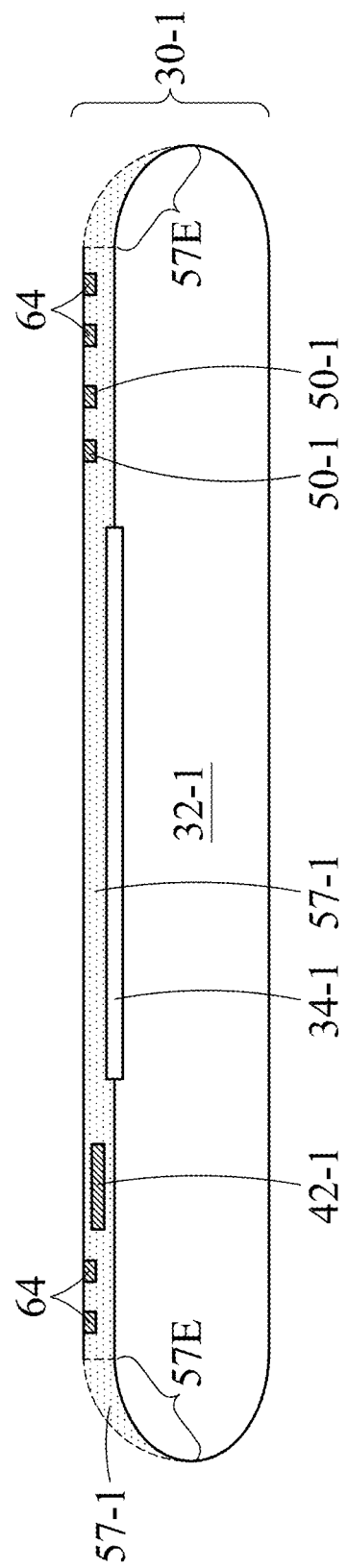
FIGS. 5-13, 14A, and 14B illustrate the intermediate stages in a wafer bonding process and a wafer edge-trimming process in accordance with some embodiments.

Referring to FIG. 5, device wafer 30-1 is provided. The details of device wafer 30-1 may be found referring to the discussion of FIGS. 3 and 4, and hence are not repeated herein. Device wafer 30-1 may be the same as the device wafer 30 in FIG. 3 or 4, except that bond layer 54 and bond pads 56 have not been formed yet, while dielectric layers 57-1 have been formed. The edge portions 57E of dielectric layers 57-1 on the edge regions of substrate 32-1 may remain, as shown in FIG. 3, or may be removed, as shown in FIG. 4. Accordingly, the edge portions 57E of dielectric layer 57-1 are shown as being dashed to indicate that the portions of dielectric layers 57-1 may or may not exist. In accordance with some embodiments, device wafer 30-1 does not include through-vias extending into substrate 32-1. In accordance with alternative embodiments, device wafer 30-1 also includes through-vias (such as through-vias 35 in FIG. 3 or FIG. 4) extending into substrate 32-1, depending on whether there will be another device wafer bonded to the bottom side of substrate 32-1 or not.

In accordance with some embodiments, metallic features 64 are formed at the top surface of wafer 30-1. Metal features 64 may be formed in the same processes as, and are formed of the same materials as, metal pads 50-1, which correspond to metal pads 50 in FIG. 3 or FIG. 4. In accordance with some embodiments, metallic features 64 include dummy metal pads, alignment marks (such as the alignment marks 55 as shown in FIGS. 3 and 4), signal lines, and/or the like.

Figure 6:
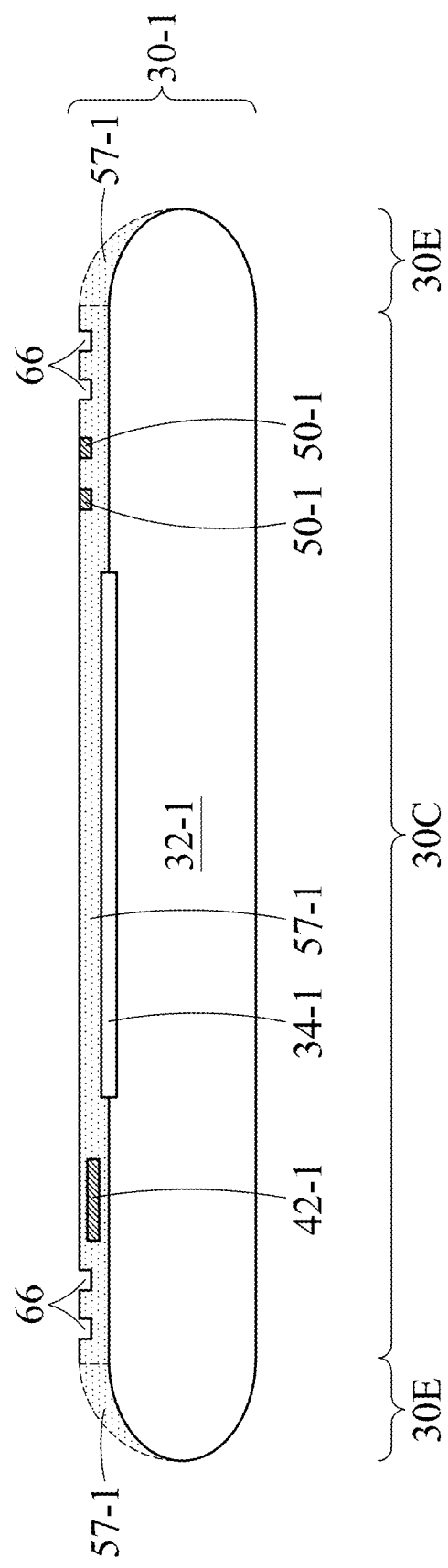

The manufacturing process of wafers may include some cleaning processes, which may include a bevel removal process to remove some undesirable materials from the edge regions of the wafers. For example, the cleaning processes may include the removal of the deposited metal films, such as the deposited metal for forming metal pads 50 and conductive features 64. The cleaning process may result in some of the metal features 64 to be removed. As a result, as shown in FIG. 6, recesses 66 are formed close to the edge regions of wafer 30-1. The respective process is illustrated as process 202 in the process flow 200 as shown in FIG. 22. In accordance with some embodiments, each or some of recesses 66 are surrounded by a dielectric material, and the material immediately underlying recesses 66 may also be a dielectric material. Alternatively stated, all sidewalls and the bottoms of the recesses 66 may be the surfaces of dielectric materials. Some metal features (not shown) may also be underlying and revealed to some of recesses 66.

Figure 7:
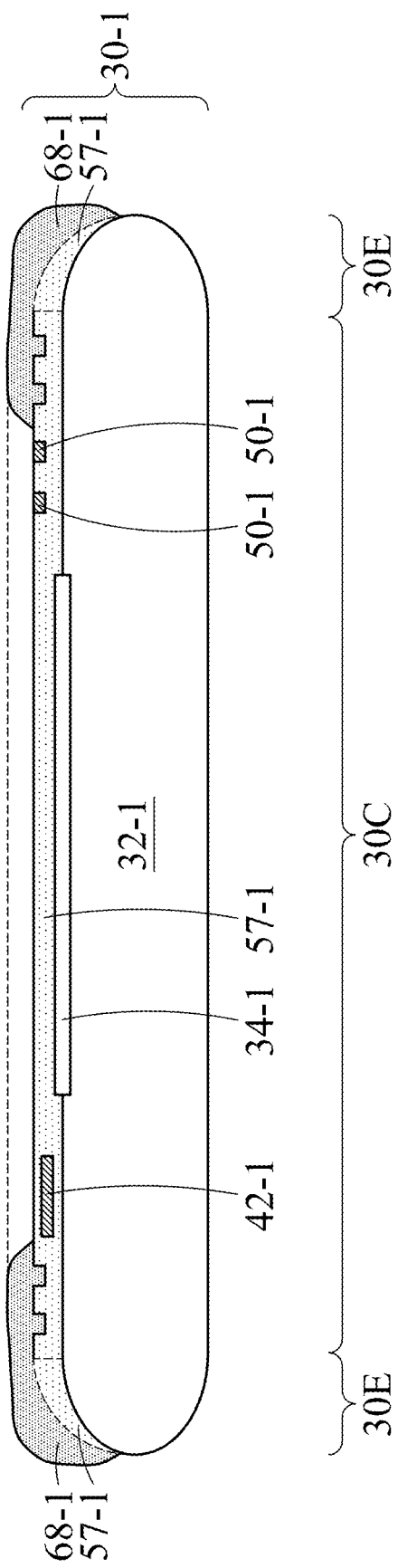

Referring to FIG. 7, sealing layer 68-1 is formed. The respective process is illustrated as process 204 in the process flow 200 as shown in FIG. 22. In accordance with some embodiments, sealing layer 68-1 is formed using a material that may endure temperatures higher than about 150° C., or higher than about 200° C., which temperatures are adopted in subsequent processes such as the wafer bonding process and other processes. In accordance with some embodiments, sealing layer 68-1 is formed of an inorganic material. For example, sealing layer 68-1 may be formed of a flowable material, which is applied through dispensing or spin-on coating. The flowable material is then cured, for example, in a thermal process, and is solidified. The resulting sealing layer 68-1, after the curing, may comprise a spin-on glass, which may comprise silicon oxide. In accordance with yet alternative embodiments, sealing layer 68-1 may be formed of an organic material such as a polymer, and/or Spin-On-Glass (SOG), which may include Si, O, organic matter, or the like.

In accordance with alternative embodiments, sealing layer 68-1 may be formed through a deposition process such as CVD, PECVD, ALD, or the like. The corresponding sealing layer 68-1 may include silicon oxide, silicon nitride, silicon, oxycarbide, or the like, or combinations thereof. Sealing layer 68-1 may also be formed of silicon, which has good adhesion to the underlying substrate 32-1, and may not have may mismatch in Coefficients of Thermal Expansion (CTEs) between sealing layer 68-1 and substrate 32. When formed of or comprise silicon, sealing layer 68-1 may be formed through epitaxy, and hence sealing layer 68-1 may comprise crystalline silicon. Accordingly, there may not be any distinguishable interface formed between sealing layer 68-1 and substrate 32. Alternatively, there may be an interface when there is a difference in the composition of sealing layer 68-1 and substrate 32. For example, substrate 32 may include a p-type or an n-type impurity, while sealing layer 68-1 may be free from any p-type and n-type impurity. When formed of or comprise silicon, sealing layer 68-1 may also have a polycrystalline or amorphous structure. When the sealing layer 68-1 is blanket deposited, it also covers the center portion of dielectric layers 57. Accordingly, a dashed line is shown to represent the corresponding portion of sealing layer 68-1.

Figure 8:
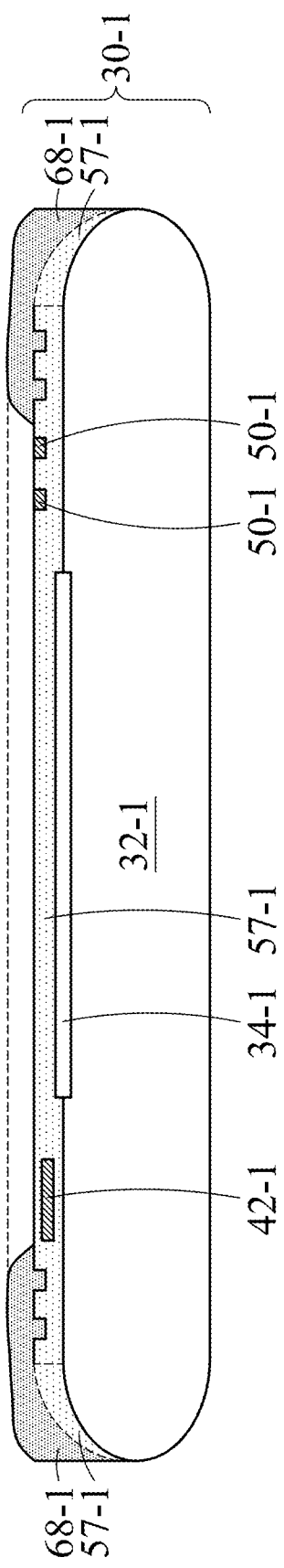

Sealing layer 68-1 fills recesses 66. Furthermore, sealing layer 68-1 includes some portions over the edge portions of substrate 32-1. Next, as shown in FIG. 8, an edge-shaping process may be performed to modify the edges of sealing layer 68-1, so that the edges of sealing layer 68-1 become vertical and straight (and having circular shape when viewed from top), which edges are shown in FIG. 8. The respective process is illustrated as process 206 in the process flow 200 as shown in FIG. 22. In accordance with some embodiments, the edge-shaping process is performed by forming an etching mask (not shown) such as a patterned photoresist, etching the edge portions of sealing layer 68-1, and removing the etching mask. The etching may be performed through an anisotropic etching process.

Figure 9:
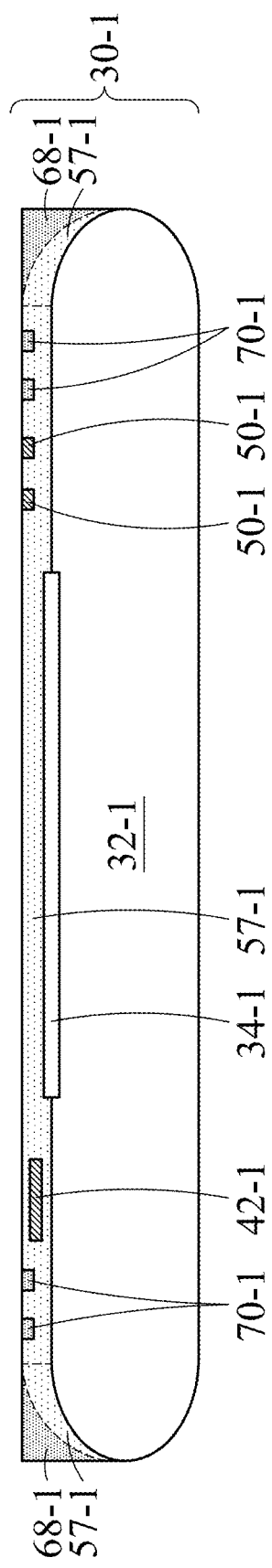

Next, a planarization process is performed to remove excess portions of sealing layer 68-1 higher than the top surface of the top layer in dielectric layers 57, which top layer may be the dielectric layer 52 in FIG. 3 or 4. The respective process is illustrated as process 208 in the process flow 200 as shown in FIG. 22. The resulting structure is shown in FIG. 9. The planarization process may be a Chemical Mechanical Polishing (CMP) process or a mechanical grinding process. Accordingly, the top surfaces of sealing layer 68-1 and the top dielectric layer in dielectric layers 57 are coplanar. The portions of sealing layer 68-1 filling recesses 66 (FIG. 6) are referred to as dummy features 70-1 hereinafter. In accordance with some embodiments, dummy features 70-1 are formed of a material different from, or the same as, the material of the top dielectric layer (such as dielectric layer 52 in FIG. 3 or FIG. 4). In the top view, dummy features 70-1 may include a plurality of elongated strips, a plurality of rectangular features, L-shaped features, and/or the like. Regardless of whether the materials of dummy features 70-1 and the top dielectric layer are the same as each other or different from each other, there may be distinguishable interfaces between them.

Figure 10:
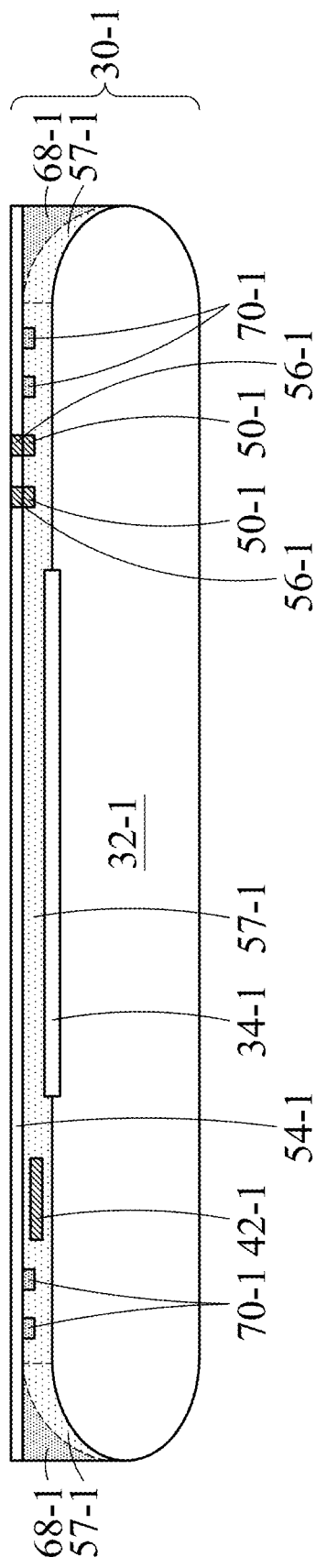

Referring to FIG. 10, bond layer 54-1 and bond pads 56-1 are formed. The details of bond layer 54-1 and bond pads 56-1 have been discussed in detail referring to FIG. 3, and are not repeated herein. The respective process is illustrated as process 210 in the process flow 200 as shown in FIG. 22.

Figure 11:
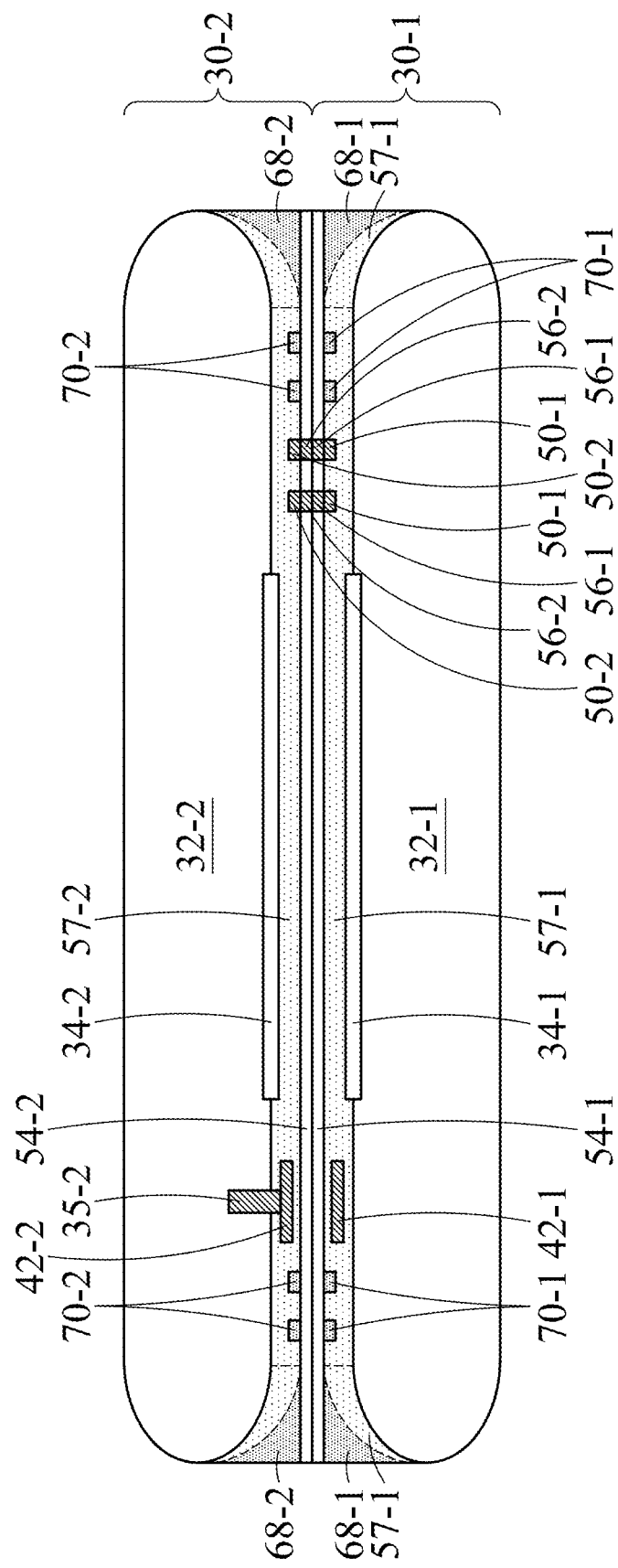

Next, as shown in FIG. 11, device wafer 30-2 is bonded to device wafer 30-1, for example, through hybrid bonding. The respective process is illustrated as process 212 in the process flow 200 as shown in FIG. 22. The formation of device wafer 30-2 may be essentially the same as discussed in preceding paragraphs, and are not repeated herein. Device wafer 30-2 also includes substrate 32-2, through-vias 35-2, dummy features 70-2, sealing layer 68-2, etc. The material and the formation process for forming sealing layer 68-2 may be selected from the same candidate materials and candidate formation processes for forming sealing layer 68-1, and may be the same as, or different from, the corresponding material and process for forming sealing layer 68-2.

The bonding may also be achieved through a face-to-face bonding process. The bond pads 56-1 in device wafer 30-1 are bonded with the bond pads 56-2, so that the integrated circuits 34-1 in device wafer 30-1 and integrated circuits 34-2 in device wafer 30-2 are electrically and signally interconnected. In the bonding process, bond layers 54-1 and 54-2 are bonded to each other through fusion bonding, with Si—O—Si being generated. Bond pads 56-1 and 56-2 are bonded to each other, for example, through metal-to-metal diffusion.

In accordance with some embodiments, the bonding process involves some thermal processes, which may involve temperatures as high as about 350° C., and may be in the range between about 200° C. and about 350° C. With the use of the material that can endure these temperatures to from sealing layers 68-1 and 68-2, the damage to sealing layers 68-1 and 68-2 is avoided.

Figure 12:
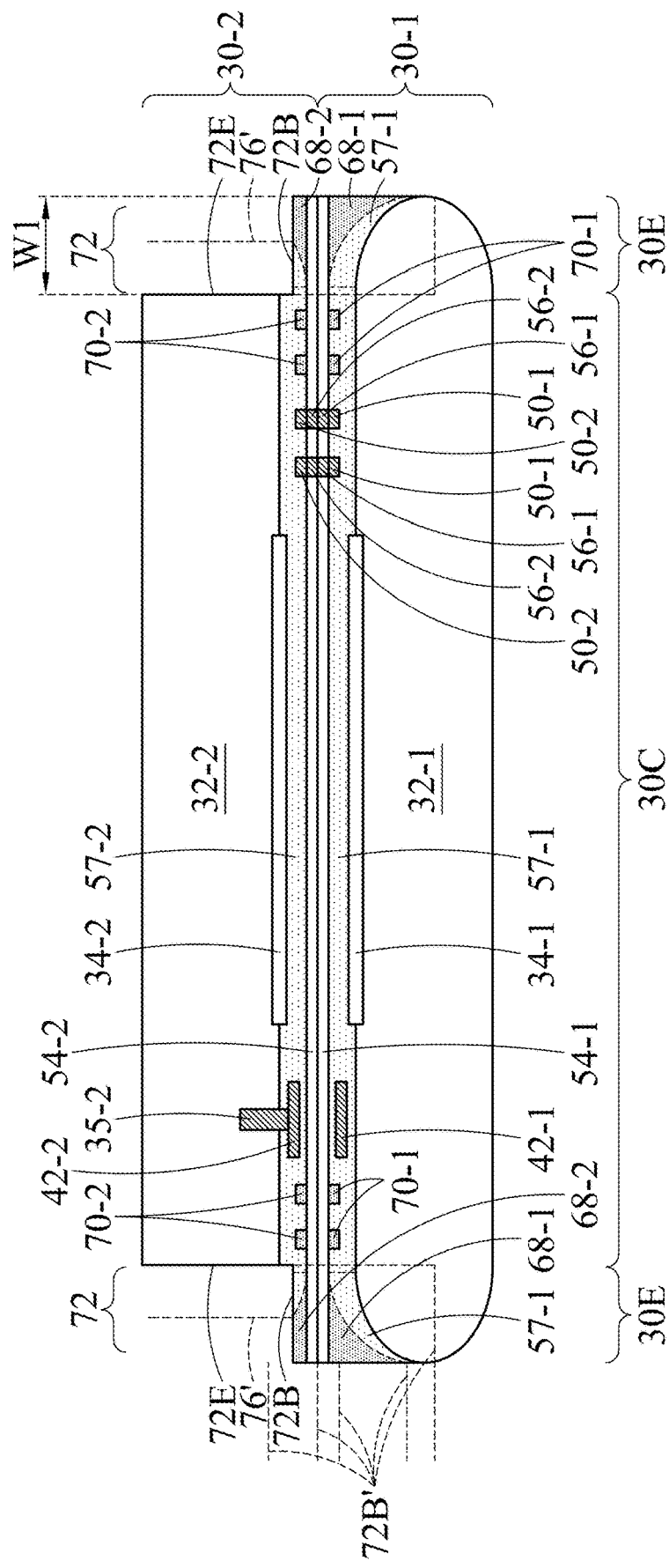

Referring to FIG. 12, an edge trimming process is performed to remove some edge portions of substrate 32-2, forming recess 72, which has edge 72E and bottom 72B. The respective process is illustrated as process 214 in the process flow 200 as shown in FIG. 22. The edge trimming process may be performed through a trimming wheel. In accordance with some embodiments, with the support of sealing layers 68-1 and 68-2, wafers 30-1 and 30-2 are less likely to crack/chip during the edge trimming process. Accordingly, the width W1 of the trimmed portions of wafer 30-2 may be kept smaller, and may be reduced to, for example, smaller than about 1.5 mm. In the trimming process, dielectric layers 57-2 may be trimmed also. In addition, the bottom of recess 72 may be at any level higher than, level with, or lower than, the bonding interface between wafers 30-1 and 30-2. For example, FIG. 12 illustrates some example levels 72B', which may be the possible bottom levels of recess 72 in accordance with various embodiments.

In accordance with some embodiments, after the edge trimming process, an entirety of sealing layer 68-1 is not trimmed, while sealing layer 68-2 may be partially trimmed, or removed entirely, depending on the positions of the edges 72E and the bottoms 72B of recess 72. Sealing layer 68-1 may have some portions remaining, or may be fully removed depending on the positions of the edges 72E and the bottoms 72B of recess 72.

Furthermore, in accordance with some embodiments, the edges 72E of recess 72 may be as shown in FIG. 12, or may be at the position shown as dashed line 76'. In the resulting bonded wafer stack, some portions of sealing layers 68-1 and 68-2 remain after the edge trimming process, and are on the inner side of the trimmed portions of wafers 30-2.

Figure 13:
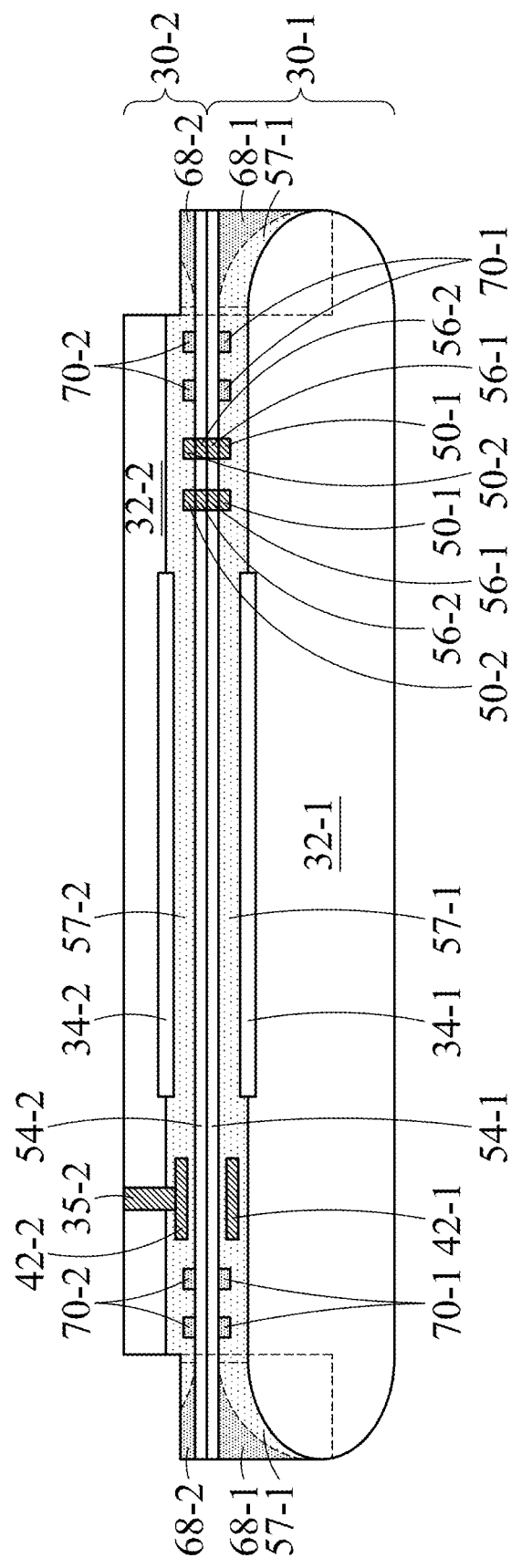
Figure 14A:
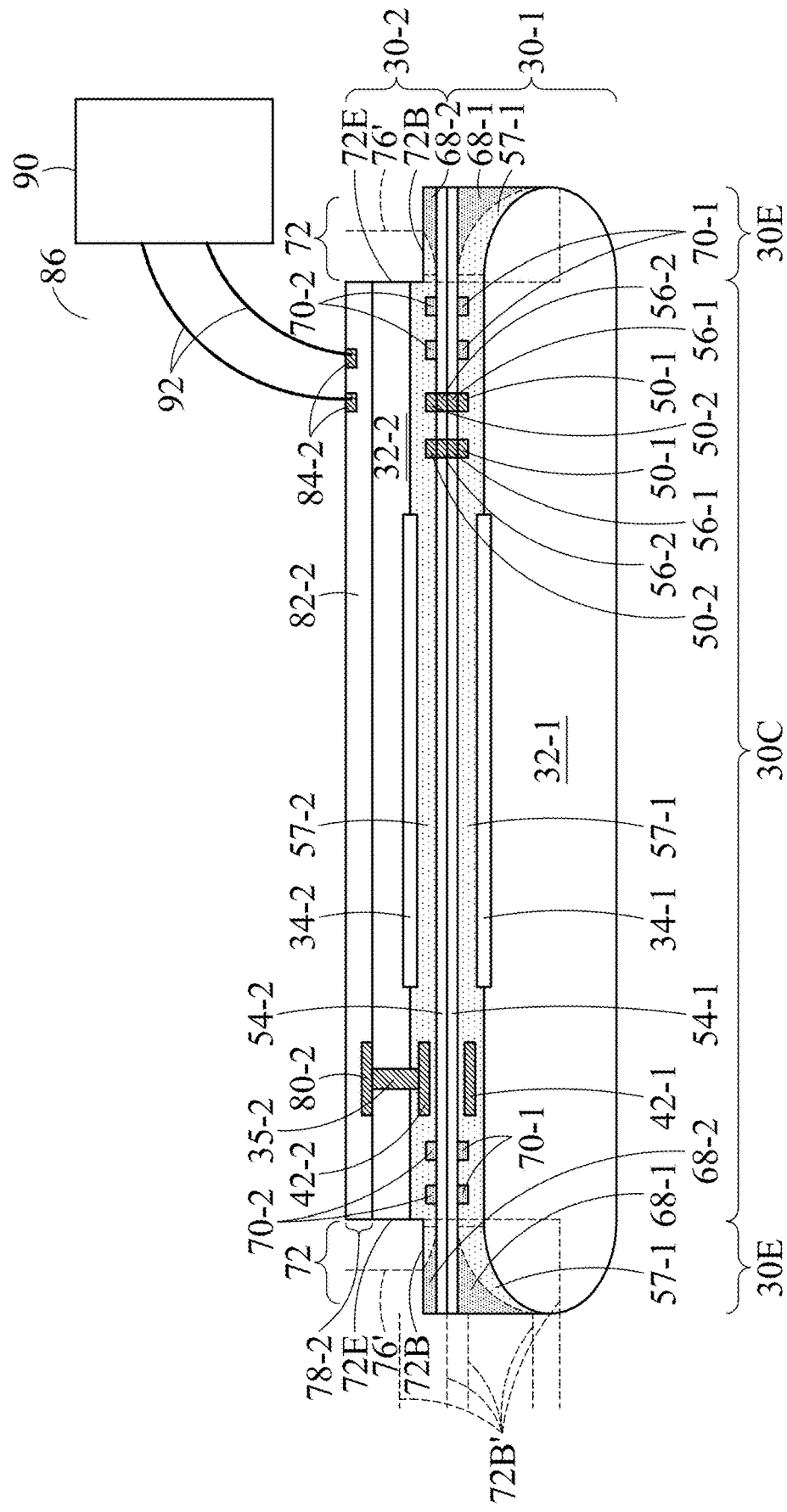

Referring to FIG. 13, a backside grinding process is performed, and through-vias 35-2 are revealed. The respective process is illustrated as process 216 in the process flow 200 as shown in FIG. 22. Next, as shown in FIG. 14A, backside interconnect structure 78-2 is formed, which includes RDLs 80-2, dielectric layers 82-2, and bond pads 84-2. Bond pads 84-2 are electrically and/or signally connected to RDLs 80-2, through-vias 35-2, and integrated circuit devices 34-2 and 34-1. Wafer stack 86 is thus formed.

The illustrated embodiments show the bonding of two wafers to form a wafer stack, if needed, more wafers may be bonded to wafer 30-2, with the wafers electrically interconnected through corresponding through-vias.

In accordance with some embodiments, wafer stack 86 is used as a whole, without being cut into discrete dies. The edge portions of wafer stack 86 not including devices may be (or may not be) trimmed. For example, FIG. 14A illustrates an example embodiment, wherein wafer stack 86 is connected to package component 90, which may be a printed circuit board, another device die or wafer, a package including device die or wafer therein, a frame, a socket, or the like. In accordance with some embodiments, wire bonds 92 are formed to electrically connect wafer stack 86 to package component 90. In accordance with other embodiments, other types of electrical connection schemes such as flip-chip bonding (such as metal-to-metal bonding or solder bonding) or the like may be used.

Figure 14B:
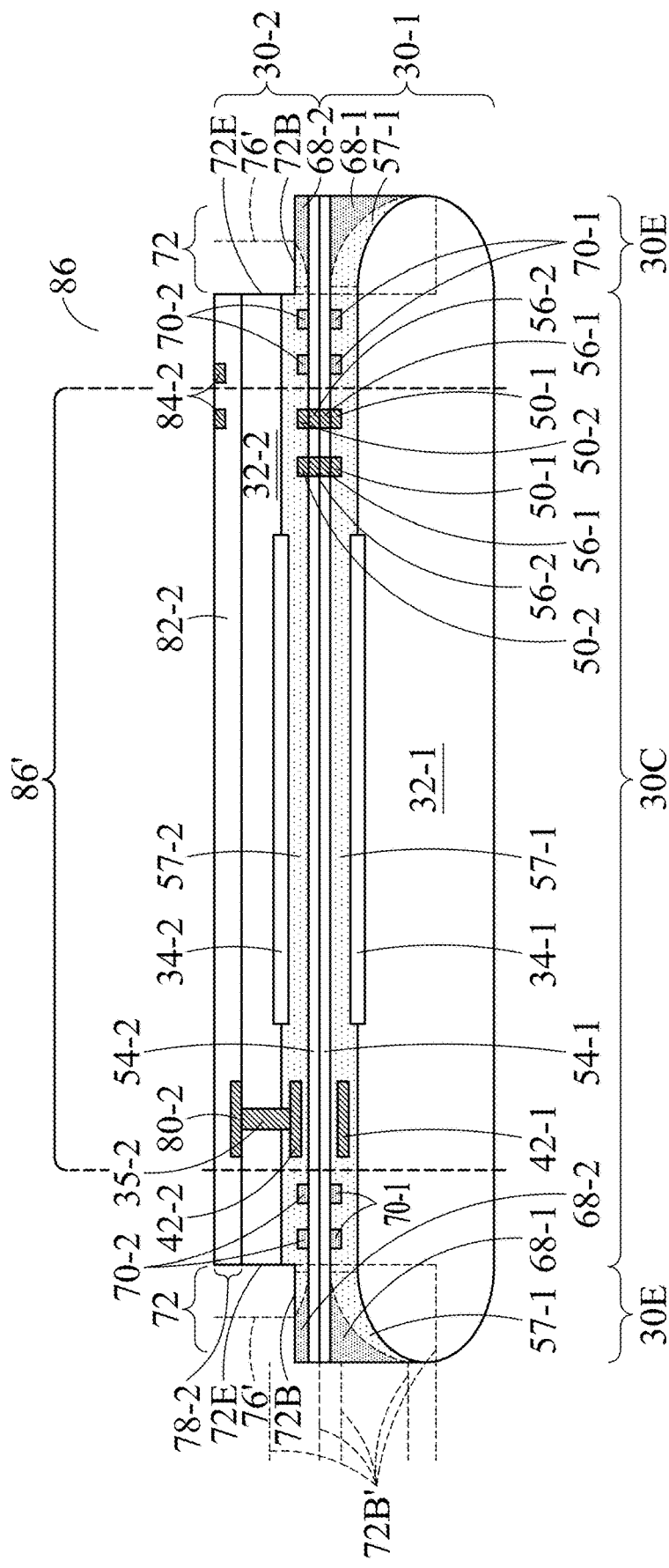

FIG. 14B illustrates an embodiment in which wafer stack 86 is singulated in sawing processes, so that a plurality of packages 86' are generated, with one package 86' shown as an example. The respective process is illustrated as process 218 in the process flow 200 as shown in FIG. 22. Packages 86' are identical to each other, with each including the features as discussed.

FIGS. 15-19, 20A, and 20B illustrate the formation of wafer stack 86 in accordance with alternative embodiments. These embodiments are similar to the preceding embodiments, except that sealing layers are applied after, rather than before, the bonding of wafers. Unless specified otherwise, the materials, the structures, and the formation processes of the components in these embodiments are essentially the same as the like components denoted by like reference numerals in the preceding embodiments. The details regarding the materials, the structures, and the formation processes of the components shown in FIGS. 15-19, 20A, and 20B may thus be found in the discussion of the preceding embodiments.

Figure 15:
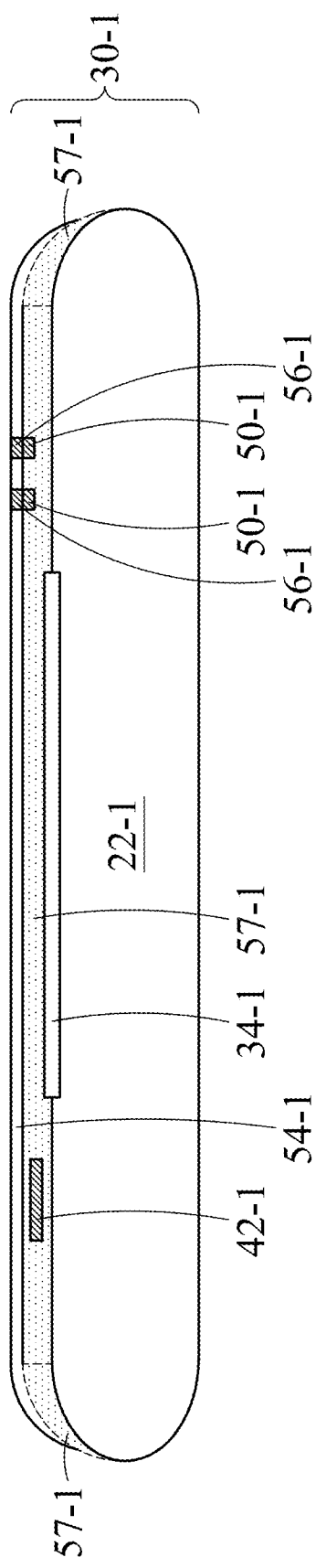
FIGS. 15-19, 20A, and 20B illustrate the intermediate stages in a wafer bonding process and a wafer edge-trimming process in accordance with some embodiments.

Referring to FIG. 15, wafer 30-1 is formed. The details of wafer 30 may be the same as shown in FIG. 3 or FIG. 4, and are not repeated herein. It is appreciated that wafer 30-1, which may be a device wafer, may also be replaced with a carrier wafer (FIG. 1 or 2) in accordance with some embodiments.

Figure 16:
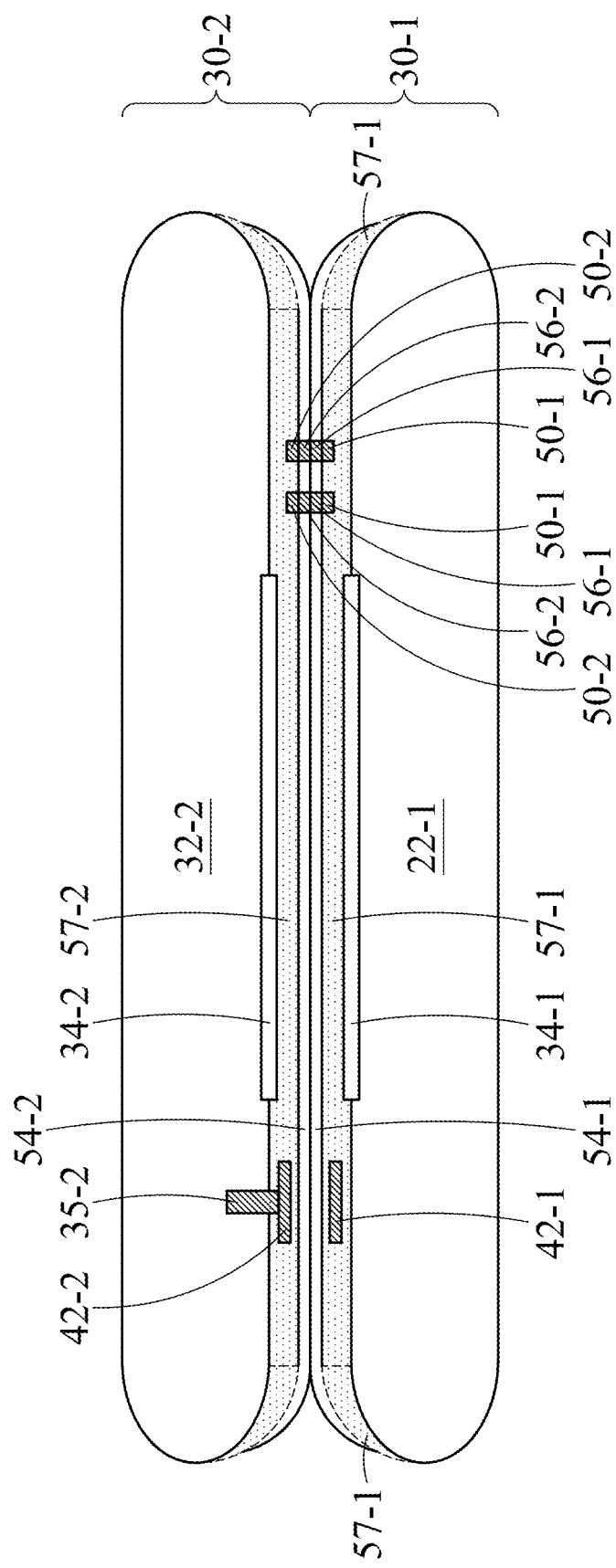

Next, as shown in FIG. 16, device wafer 30-2 is bonded to device wafer 30-1, for example, through hybrid bonding. The bonding may also be achieved through a face-to-face bonding process. The bond pads 56-1 in device wafer 30-1 are bonded with the bond pads 56-2 in device wafer 30-2, so that the integrated circuits 34-1 in device wafer 30-1 and integrated circuits 34-2 in device wafer 30-2 are electrically and signally interconnected.

Figure 17:
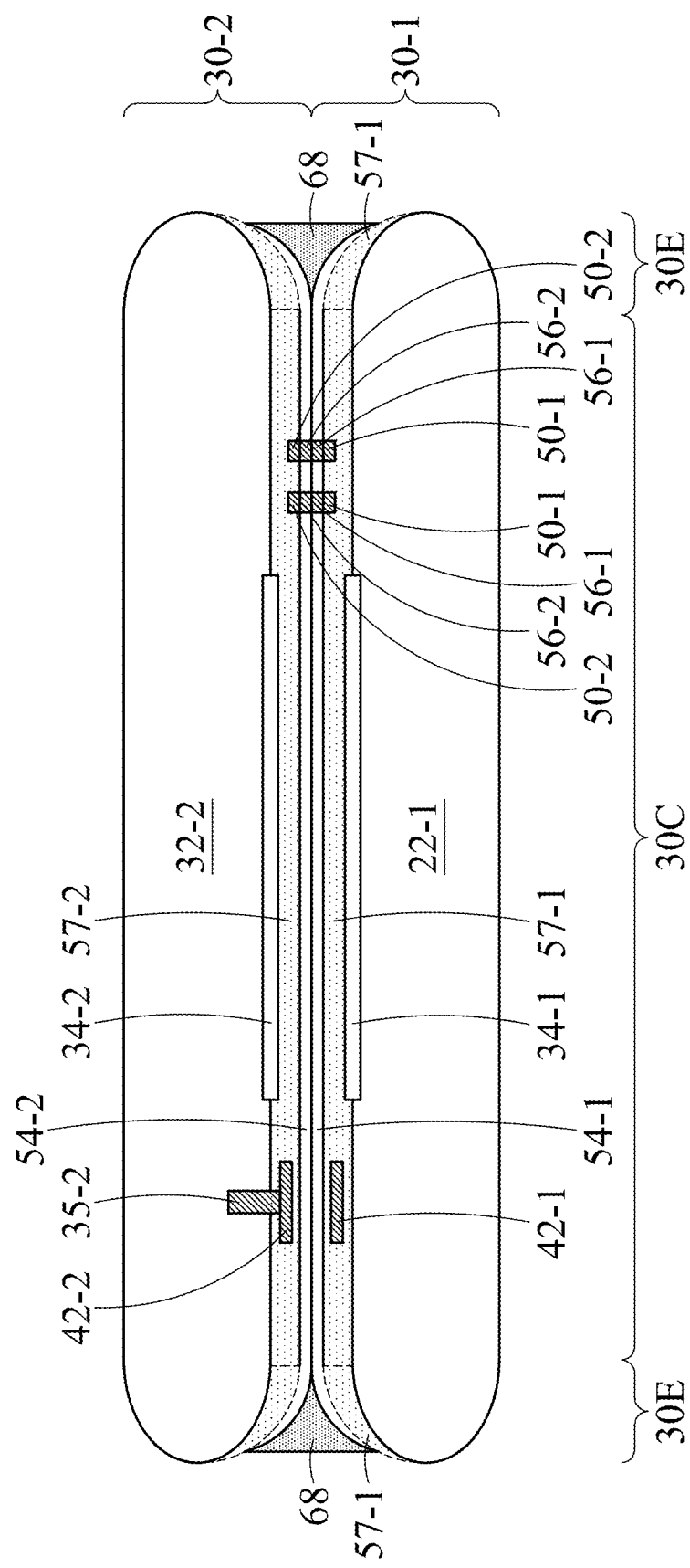

Referring to FIG. 17, sealing layer 68 is dispensed into the gap between device wafers 30-1 and 30-2. In accordance with some embodiments, the material of sealing layer 68 may endure the high temperature in subsequent processes. The candidate material and the candidate formation processes for forming sealing layer 68 may be found referring to the discussion of sealing layer 68-1 (FIG. 7). In accordance with some embodiments, sealing layer 68 is formed of or comprises an inorganic material such as a spin-on glass formed through spin-on coating, and may comprise silicon oxide. In accordance with some embodiments, sealing layer 68 is formed of or comprises a high temperature polymer, SOG, or the like.

Figure 18:
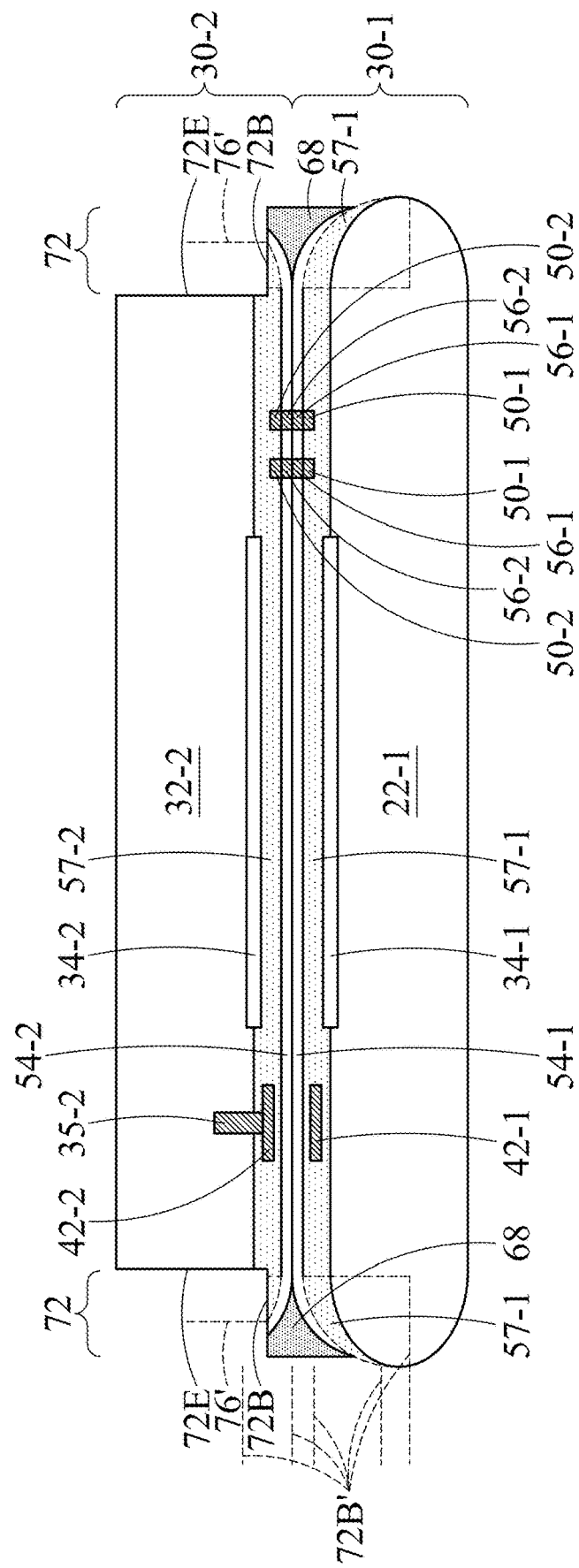

Referring to FIG. 18, an edge trimming process is performed to remove the edge portions of wafer 30-2 and to form recess 72. The bottom 72B of recess 72 may be limited in wafer 30-2, or may extend into wafer 30-1. For example, dashed lines 72B' illustrate the possible positions of the bottom of recess 72. Also, the edges of recess 72 may be as shown in FIG. 18, or may be at the positions shown by vertical lines 76'. Accordingly, after the edge trimming process, sealing layer 68 may have some portions remaining, or may be fully removed. Alternatively, when recess 72 is limited in wafer 30-2, there may not be any portion of sealing layer 68 removed in accordance with some embodiments.

Figure 19:
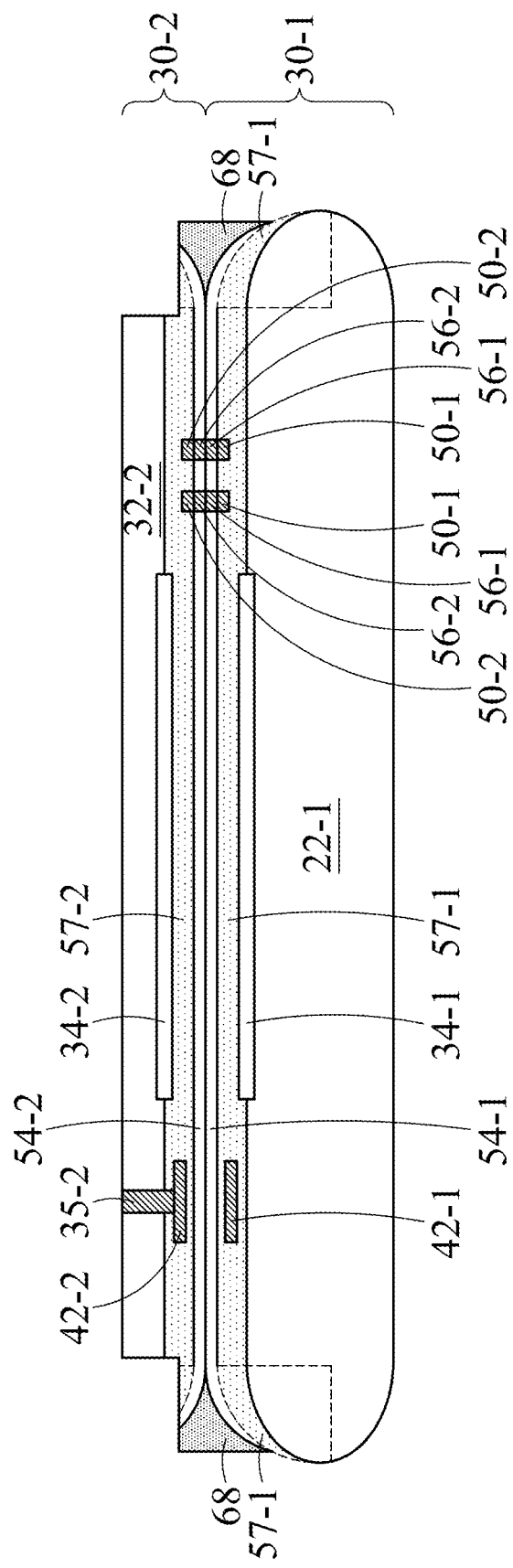
Figure 20A:
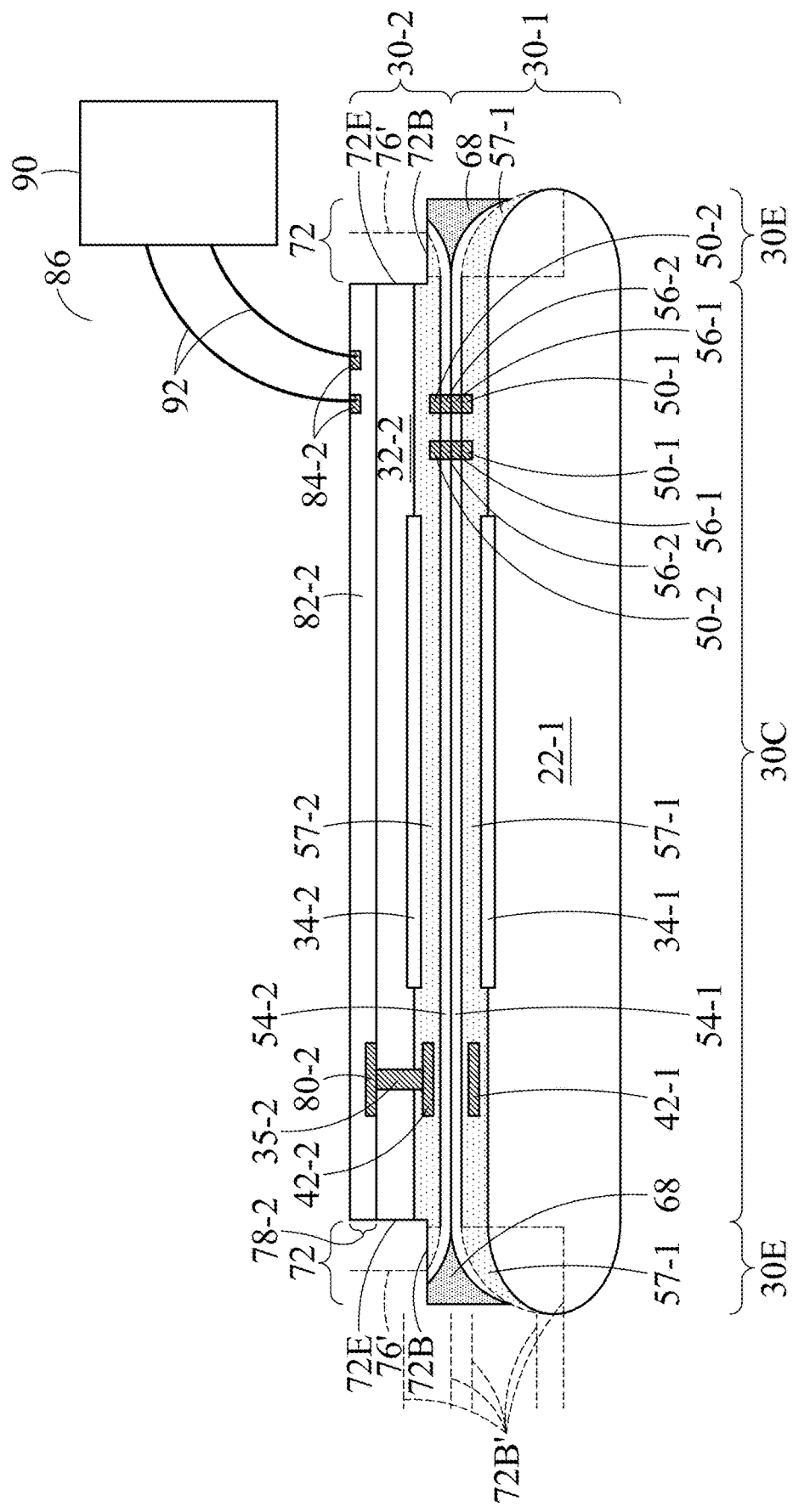

Referring to FIG. 19, a backside grinding process is performed, and through-vias 35-2 are revealed. If needed, more wafers may be bonded over wafer 30-2 or under wafer 30-1. In accordance with some embodiments, as shown in FIG. 20A, backside interconnect structure 78-2 is formed, which includes RDLs 80-2, dielectric layers 82-2, and bond pads 84-2. Bond pads 84-2 are electrically and/or signally connected to RDLs 80-2, through-vias 35-2, and integrated circuit devices 34-2 and 34-1. Wafer stack 86 is thus formed.

Figure 20B:
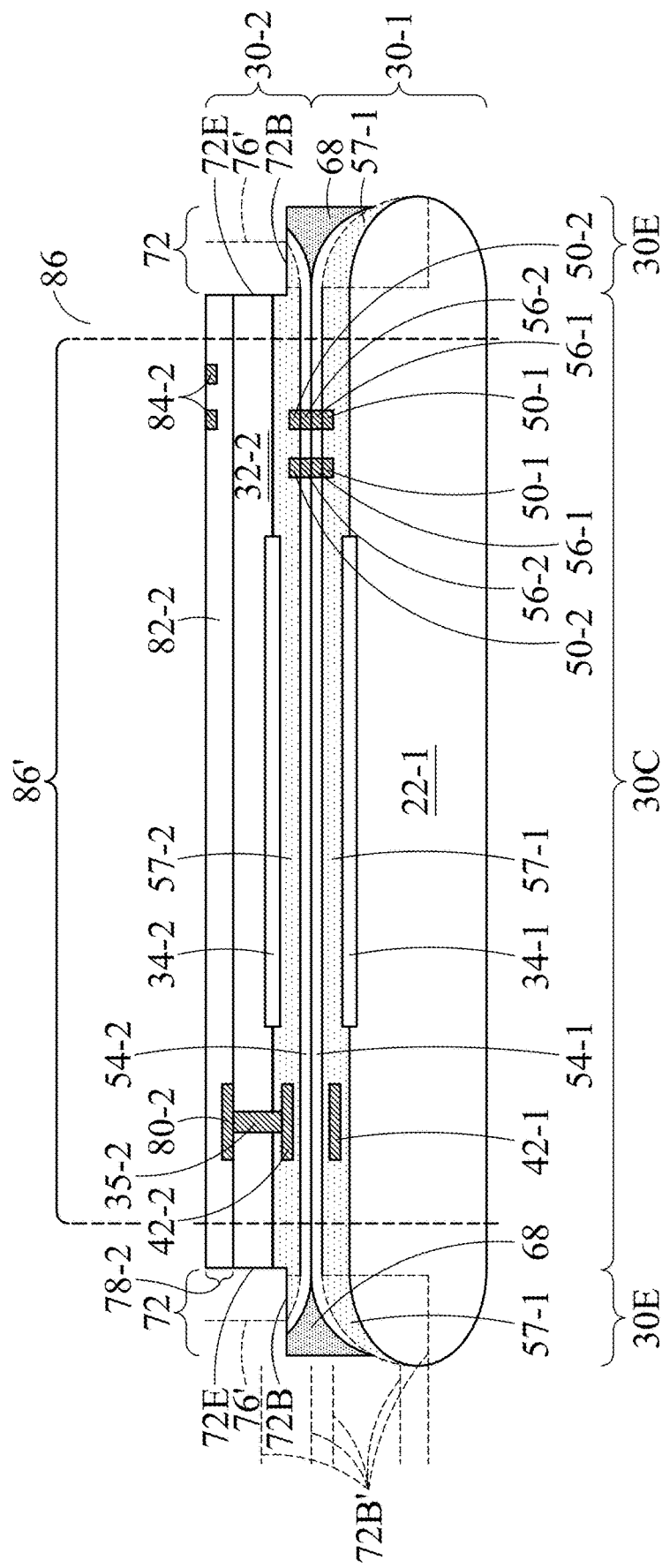

In accordance with some embodiments, similar to the embodiments shown in FIG. 14A, wafer stack 86 is used as a whole, without being cut into discrete dies. The resulting package is also shown in FIG. 20A. FIG. 20B illustrates an embodiment in which wafer stack 86 is singulated in sawing processes, so that a plurality of packages 86' are generated. Packages 86' are identical to each other, with each including the features as discussed.

Figure 21:
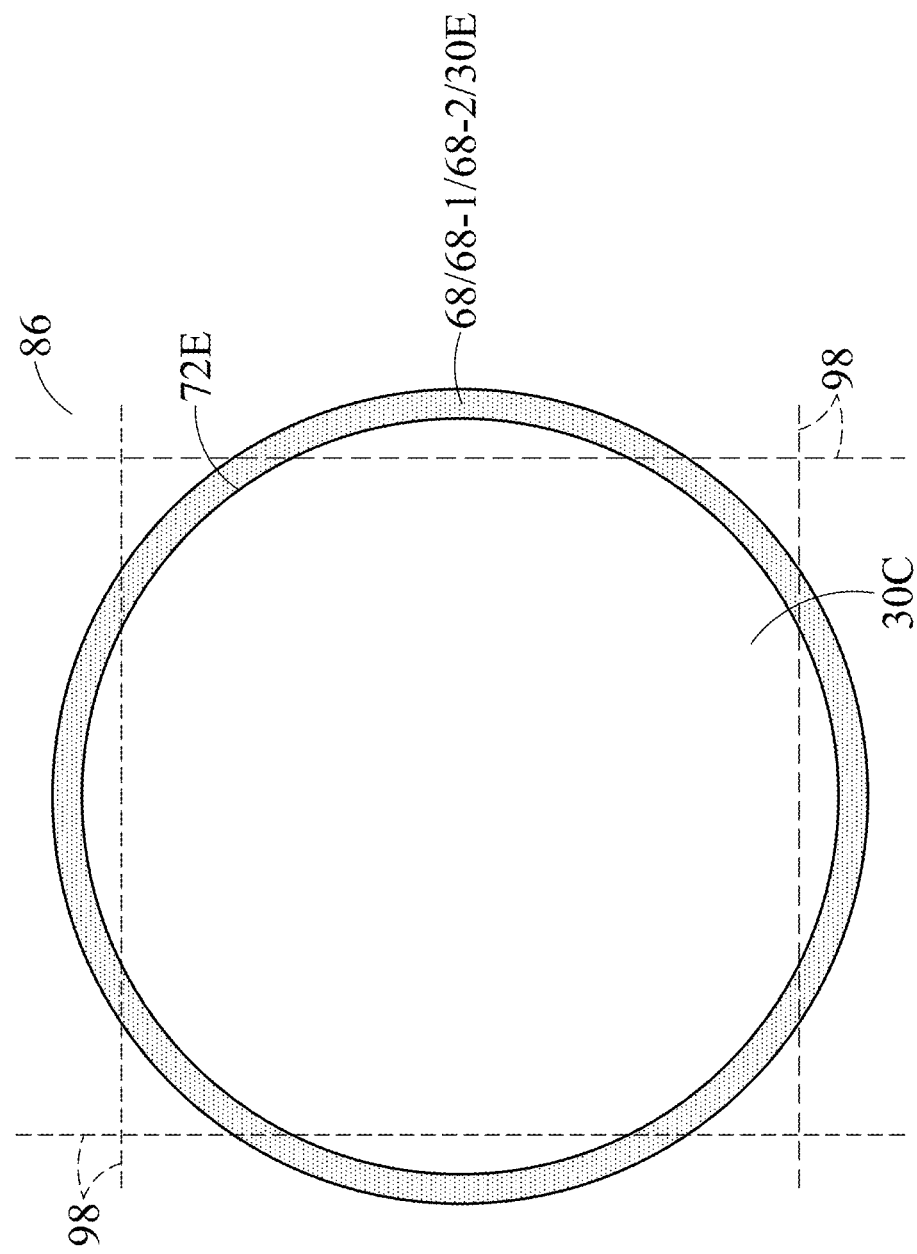
FIG. 21 illustrates a top view of a wafer stack in accordance with some embodiments.

FIG. 21 illustrates a top view of the embodiments as shown in FIG. 14A, 14B, 20A, or 20B in accordance with some embodiments. It is observed that wafer stack 86 include sealing layer(s) 68, 68-1, and/or 68-2 forming a full ring at the peripheral region of wafer stack 86. In accordance with some embodiments in which wafer stack 86 is used as a whole, the edges of wafer stack 86 may be trimmed along trimming lines 98. The resulting wafer 86 thus include straight edges and rounded edges. Accordingly, sealing layer(s) 68, 68-1, and/or 68-2 will have some portions left close to the rounded edges, and may be removed from the portions close to the straight edges. In accordance with alternative embodiments, wafer stack 86 is not trimmed along trimming lines 98, and the resulting wafer stack 86

(when used and powered up) has a circular edge. Sealing layer(s) 68, 68-1, and/or 68-2 will also have a full ring-shape.

In the above-discussed illustrative embodiments, the bonding of device dies are used as an example, in accordance with alternative embodiments, a bottom wafer may be a carrier wafer 20, as shown in FIG. 1 or FIG. 2. One or a plurality of device wafers 30 (FIG. 3 or FIG. 4) are bonded over the carrier wafer 20 to form the respective wafer stack. The plurality of device wafers 30 may have an identical structure or different structures. After the plurality of device wafers are bonded, the carrier wafer may be removed from the wafer stack. Alternatively, the carrier wafer 20 may remaining in the final structure.

The embodiments of the present disclosure have some advantageous features. By forming the sealing layers before the wafer bonding process, deposition processes (such as ALD, CVD, or the like) may be used for the formation of the sealing layers. There thus be more available materials for forming the sealing layers. By forming the sealing layers using materials that can endure high temperatures, the sealing layers will not be damaged in subsequent processes. This makes it possible for leaving the sealing layers in the resulting wafer stack, and hence the sealing layers may provide more support in the subsequent processes.

In accordance with some embodiments of the present disclosure, a method includes forming a first sealing layer at a first edge region of a first wafer; and bonding the first wafer to a second wafer to form a wafer stack. At a time after the bonding, the first sealing layer is between the first edge region of the first wafer and a second edge region of the second wafer, with the first edge region and the second edge region comprising bevels. An edge trimming process is then performed on the wafer stack. After the edge trimming process, the second edge region of the second wafer is at least partially removed, and a portion of the first sealing layer is left as a part of the wafer stack. An interconnect structure is formed as a part of the second wafer. The interconnect structure includes redistribution lines electrically connected to integrated circuit devices in the second wafer.

In an embodiment, the first sealing layer is formed through spin-on coating. In an embodiment, the first sealing layer is formed after the first wafer is bonded to the second wafer. In an embodiment, the first sealing layer is formed before the first wafer is bonded to the second wafer, and wherein the forming the first sealing layer comprises forming the first sealing layer on the first wafer; and performing a planarization process to level a first top surface of the first sealing layer with a second top surface of the first wafer. In an embodiment, the forming the first sealing layer further comprises performing an etching process to shape edges of the first sealing layer.

In an embodiment, the method further comprises, after the planarization process, forming a bond layer on the first wafer and the first sealing layer. In an embodiment, the method further comprises, before the first wafer is bonded to the second wafer, forming a second sealing layer on the second wafer; and performing an additional planarization process on the second sealing layer and the second wafer. In an embodiment, the method further comprises removing a metallic feature in the first wafer to form a recess, wherein the first sealing layer comprises a portion filling the recess, and wherein after the planarization process, the portion of the first sealing layer remains in the recess. In an embodiment, the edge trimming process results in a recess to be formed in in the wafer stack, and wherein a bottom of the recess is higher than a bonding interface between the first wafer and the second wafer. In an embodiment, the edge trimming process result in a recess being formed in the wafer stack, and wherein both of the first wafer and the second wafer are trimmed.

In accordance with some embodiments of the present disclosure, a package comprises a first wafer comprising a first substrate; at least one first dielectric layer over the first substrate; a first sealing layer at a first edge region of the first wafer, wherein a first top surface of the at least one first dielectric layer is coplanar with a second top surface of the first sealing layer; a first bond layer overlapping both of the at least one first dielectric layer and the first sealing layer; and a second wafer bonding to the first wafer, wherein the second wafer comprises a second substrate; at least one second dielectric layer underlying the second substrate; a second sealing layer at a second edge region of the second wafer, wherein bottom surfaces of the at least one second dielectric layer and the second sealing layer are coplanar with each other; and a second bond layer overlapped by both of the at least one second dielectric layer and the second sealing layer, wherein the second bond layer is bonded to the first bond layer.

In an embodiment, the first bond layer comprises an inorganic dielectric material. In an embodiment, the first bond layer comprises a straight edge perpendicular to a bonding interface between the first bond layer and the second bond layer. In an embodiment, the first sealing layer and the second sealing layer are separated from each other by the first bond layer and the second bond layer. In an embodiment, the first sealing layer and the second sealing layer comprise different materials. In an embodiment, the first sealing layer and the second sealing layer are capable of enduring a temperature higher than about 200° C. without being damaged. In an embodiment, the first wafer further comprises a dummy feature underlying and contacting the first bond layer, wherein the dummy feature and the first sealing layer are formed of a same material.

In accordance with some embodiments of the present disclosure, a package comprises a first wafer comprising a first semiconductor substrate, wherein the first semiconductor substrate comprises a first curved surface in a first edge region of the first wafer; at least one first dielectric layer over the first semiconductor substrate; a first sealing layer, wherein the first sealing layer comprises a second curved surface, and wherein the second curved surface is in physical contact with one of the first semiconductor substrate and the at least one first dielectric layer; and a first bond layer comprising a planar bottom surface contacting both of the at least one first dielectric layer and the first sealing layer; and a second wafer comprising a second semiconductor substrate; and a second bond layer bonding to the first bond layer.

In an embodiment, the second semiconductor substrate comprises a third curved surface in a second edge region of the second wafer, and the second wafer comprises at least one second dielectric layer under the second semiconductor substrate; and a second sealing layer under the at least one second dielectric layer and over the second bond layer, wherein the second sealing layer comprises a fourth curved surface in the second edge region of the second wafer, with the fourth curved surface contacting the third curved surface. In an embodiment, the first sealing layer is separated from the second sealing layer by the first bond layer and the second bond layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first sealing layer at a first edge region of a first wafer;
bonding the first wafer to a second wafer to form a wafer stack, wherein at a time after the bonding, the first sealing layer is between the first edge region of the first wafer and a second edge region of the second wafer, and wherein the first edge region and the second edge region comprise bevels;
performing an edge trimming process on the wafer stack, wherein after the edge trimming process, the second edge region of the second wafer is at least partially removed, and wherein a portion of the first sealing layer is left as a part of the wafer stack; and
forming an interconnect structure as a part of the second wafer, wherein the interconnect structure comprises redistribution lines electrically connected to integrated circuit devices in the second wafer.

2. The method of claim 1, wherein the first sealing layer is formed through spin- on coating.

3. The method of claim 1, wherein the first sealing layer is formed after the first wafer is bonded to the second wafer.

4. The method of claim 1, wherein the first sealing layer is formed before the first wafer is bonded to the second wafer, and wherein the forming the first sealing layer comprises:
forming the first sealing layer on the first wafer; and
performing a planarization process to level a first top surface of the first sealing layer with a second top surface of the first wafer.

5. The method of claim 4, wherein the forming the first sealing layer further comprises performing an etching process to shape edges of the first sealing layer.

6. The method of claim 4 further comprising, after the planarization process, forming a bond layer on the first wafer and the first sealing layer.

7. The method of claim 4 further comprising, before the first wafer is bonded to the second wafer:
forming a second sealing layer on the second wafer; and
performing an additional planarization process on the second sealing layer and the second wafer.

8. The method of claim 4 further comprising:
removing a metallic feature in the first wafer to form a recess, wherein the first sealing layer comprises a portion filling the recess, and wherein after the planarization process, the portion of the first sealing layer remains in the recess.

9. The method of claim 1, wherein the edge trimming process results in a recess to be formed in the wafer stack, and wherein a bottom of the recess is higher than a bonding interface between the first wafer and the second wafer.

10. The method of claim 1, wherein the edge trimming process results in a recess being formed in the wafer stack, and wherein both of the first wafer and the second wafer are trimmed.

11. A method comprising:
forming a first wafer comprising:
a first substrate;
at least one first dielectric layer over the first substrate;
a first sealing layer at a first edge region of the first wafer, wherein a first top surface of the at least one first dielectric layer is coplanar with a second top surface of the first sealing layer; and
a first bond layer overlapping both of the at least one first dielectric layer and the first sealing layer;
forming a second wafer, wherein the second wafer comprises:
a second substrate;
at least one second dielectric layer underlying the second substrate;
a second sealing layer at a second edge region of the second wafer, wherein bottom surfaces of the at least one second dielectric layer and the second sealing layer are coplanar with each other; and
a second bond layer overlapped by both of the at least one second dielectric layer and the second sealing layer; and
bonding the second wafer to the first wafer by bonding the second bond layer to the first bond layer.

12. The method of claim 11, wherein the first bond layer comprises an inorganic dielectric material.

13. The method of claim 11, wherein the first bond layer comprises a straight edge perpendicular to a bonding interface between the first bond layer and the second bond layer.

14. The method of claim 11, wherein the first sealing layer and the second sealing layer are separated from each other by the first bond layer and the second bond layer.

15. The method of claim 11, wherein the first sealing layer and the second sealing layer comprise different materials.

16. The method of claim 11, wherein the first sealing layer and the second sealing layer are capable of enduring a temperature higher than about 200° C. without being damaged.

17. The method of claim 11, wherein the first wafer further comprises a dummy feature underlying and contacting the first bond layer, wherein the dummy feature and the first sealing layer are formed of a same material.

18. A method comprising:
forming a first wafer comprising:
a first semiconductor substrate, wherein the first semiconductor substrate comprises a first curved surface in a first edge region of the first wafer;
at least one first dielectric layer over the first semiconductor substrate;
a first sealing layer, wherein the first sealing layer comprises a second curved surface, and wherein the second curved surface is in physical contact with one of the first semiconductor substrate and the at least one first dielectric layer; and
a first bond layer comprising a planar bottom surface contacting both of the at least one first dielectric layer and the first sealing layer;
forming a second wafer comprising:
a second semiconductor substrate; and
a second bond layer; and
bonding the second wafer to the first wafer, with the second bond layer bonding to the first bond layer.

19. The method of claim 18, wherein the second semiconductor substrate comprises a third curved surface in a second edge region of the second wafer, and the second wafer comprises:

at least one second dielectric layer under the second semiconductor substrate; and a second sealing layer under the at least one second dielectric layer and over the second bond layer, wherein the second sealing layer comprises a fourth curved surface in the second edge region of the second wafer, with the fourth curved surface contacting the third curved surface.

20. The method of claim 19, wherein the first sealing layer is separated from the second sealing layer by the first bond layer and the second bond layer.

\* \* \* \* \*